(12) United States Patent
Kishimoto et al.

(10) Patent No.: US 11,127,726 B2
(45) Date of Patent: Sep. 21, 2021

(54) METHOD AND DEVICE FOR MANUFACTURING FLEXIBLE LIGHT EMISSION DEVICE

(71) Applicant: SAKAI DISPLAY PRODUCTS CORPORATION, Sakai (JP)

(72) Inventors: Katsuhiko Kishimoto, Sakai (JP); Kazunobu Mameno, Sakai (JP); Kohichi Tanaka, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

(21) Appl. No.: 16/967,705

(22) PCT Filed: May 9, 2018

(86) PCT No.: PCT/JP2018/017900
§ 371 (c)(1),
(2) Date: Oct. 7, 2020

(87) PCT Pub. No.: WO2019/215831
PCT Pub. Date: Nov. 14, 2019

(65) Prior Publication Data
US 2021/0057399 A1 Feb. 25, 2021

(51) Int. Cl.
*H01L 25/16* (2006.01)
*H01L 27/32* (2006.01)
(Continued)

(52) U.S. Cl.
CPC ............ *H01L 25/167* (2013.01); *B32B 17/10* (2013.01); *H01L 27/3244* (2013.01);
(Continued)

(58) Field of Classification Search
CPC ... H01L 51/56; H01L 51/5253; H01L 51/524; H01L 51/0097; H01L 25/167;
(Continued)

(56) References Cited

U.S. PATENT DOCUMENTS

2012/0164408 A1 6/2012 Hwu et al.
2013/0011969 A1 1/2013 Chen et al.
(Continued)

FOREIGN PATENT DOCUMENTS

CN 106024704 A 10/2016
JP 2014-048619 A 3/2014
(Continued)

OTHER PUBLICATIONS

Lee et al.: "54.1: Invited Paper: A Novel Approach to Make Flexible Active Matrix Displays" The Society for Information Display 2010 International Symposium Digest of Technical Papers, Sessions 44-80, vol. XLI, Book II, Washington State Convention Center, Seattle Washington, May 27 & 28, 2010, pp. 810-813.

*Primary Examiner* — Thao X Le
*Assistant Examiner* — Gardner W. S. Swan
(74) *Attorney, Agent, or Firm* — ScienBiziP, P.C.

(57) ABSTRACT

According to a flexible light-emitting device production method of the present disclosure, after an intermediate region (30*i*) and flexible substrate regions (30*d*) of a plastic film (30) of a multilayer stack (100) are divided from one another, the interface between the flexible substrate regions (30*d*) and a glass base (10) is irradiated with lift-off light. The multilayer stack (100) is separated into a first portion (110) and a second portion (120) while the multilayer stack (100) is in contact with a stage (210). The first portion (110) includes a plurality of light-emitting devices (1000) which are in contact with the stage (210). The light-emitting devices (1000) include a plurality of functional layer regions (20) and the flexible substrate regions (30*d*). The second portion (120) includes the glass base (10) and the intermediate region (30*i*). The step of irradiating with the lift-off light includes the first light scanning for scanning the interface in a first direction with the light in the form of a line beam, and the second light scanning for scanning the inter- (Continued)

face in a second direction with the light. In each of the first and second light scanning, the irradiation intensity is modulated such that the intensity for at least part of the interface between the intermediate region (30i) and the glass base (10) is lower than the irradiation intensity for the interface between the flexible substrate regions (30d) and the glass base (10).

11 Claims, 27 Drawing Sheets

(51) Int. Cl.
*H01L 33/00* (2010.01)
*H01L 51/00* (2006.01)
*H01L 51/56* (2006.01)
*B32B 17/10* (2006.01)

(52) U.S. Cl.
CPC ........ *H01L 33/005* (2013.01); *H01L 51/0097* (2013.01); *H01L 51/56* (2013.01); *H01L 2227/326* (2013.01); *H01L 2251/566* (2013.01)

(58) Field of Classification Search
CPC ................. H01L 27/156; H01L 33/005; H01L 2227/326; H01L 2251/566; B32B 17/10; G09F 9/30; G09F 9/33; H05B 33/10
See application file for complete search history.

(56) References Cited

U.S. PATENT DOCUMENTS

| | | |
|---|---|---|
| 2014/0065916 A1 | 3/2014 | Lee et al. |
| 2014/0127480 A1 | 5/2014 | Masuda |
| 2015/0059987 A1 | 3/2015 | Kumakura et al. |
| 2015/0194636 A1 | 7/2015 | Okumura |
| 2015/0210048 A1 | 7/2015 | Jeong et al. |
| 2017/0263488 A1 | 9/2017 | Liu et al. |
| 2019/0044096 A1 | 2/2019 | Tanaka |
| 2019/0363264 A1 | 11/2019 | Kishimoto et al. |
| 2020/0287356 A1* | 9/2020 | Kishimoto ............ H01S 5/4043 |

FOREIGN PATENT DOCUMENTS

| | | |
|---|---|---|
| JP | 2015-525143 A | 9/2015 |
| JP | 2015-173088 A | 10/2015 |
| JP | 6334079 B1 | 5/2018 |
| WO | 2012/164612 A1 | 12/2012 |
| WO | 2014/024479 A1 | 2/2014 |
| WO | 2015/190418 A1 | 12/2015 |
| WO | 2017/045202 A1 | 3/2017 |
| WO | 2017/115484 A1 | 7/2017 |

* cited by examiner

METHOD AND DEVICE FOR MANUFACTURING FLEXIBLE LIGHT EMISSION DEVICE

TECHNICAL FIELD

The present disclosure relates to a method and apparatus for producing a flexible light-emitting device.

BACKGROUND ART

A typical example of the flexible display includes a film which is made of a synthetic resin such as polyimide (hereinafter, referred to as "plastic film"), and elements supported by the plastic film, such as TFTs (Thin Film Transistors) and OLEDs (Organic Light Emitting Diodes). The plastic film functions as a flexible substrate. The flexible display is encapsulated with a gas barrier film (encapsulation film) because an organic semiconductor layer which is a constituent of the OLED is likely to deteriorate due to water vapor.

Production of the above-described flexible display is carried out using a glass base on which a plastic film is formed over the upper surface. The glass base functions as a support (carrier) for keeping the shape of the plastic film flat during the production process. TFT devices, light-emitting devices such as OLEDs, a gas barrier film, and the other constituents are formed on the plastic film, whereby the structure of a flexible display is realized while it is supported by the glass base. Thereafter, the flexible display is delaminated from the glass base and gains flexibility. The entirety of a portion in which TFT devices and light-emitting devices such as OLEDs are arrayed can be referred to as "functional layer region".

According to the prior art, a sheet-like structure including a plurality of flexible displays is delaminated from a glass base, and thereafter, optical parts and other constituents are mounted to this sheet-like structure. Thereafter, the sheet-like structure is divided into a plurality of flexible devices. This dividing is realized by, for example, laser beam irradiation.

Patent Document No. 1 discloses the method of irradiating the interface between each flexible display and the glass base with laser light in order to delaminate each flexible display from the glass base (supporting substrate). According to the method disclosed in Patent Document No. 1, after irradiation with the lift-off light, respective flexible displays are divided from one another, and each of the flexible displays is delaminated from the glass base.

CITATION LIST

Patent Literature

Patent Document No. 1: Japanese Laid-Open Patent

SUMMARY OF INVENTION

Technical Problem

According to the conventional production method, the dividing by means of laser beam irradiation is carried out after expensive parts, for example, encapsulation film, polarizer, and/or heat radiation sheet, are mounted to a sheet-like structure including a plurality of flexible displays. Therefore, unnecessary portions divided by laser beam irradiation, i.e., portions which are not to be constituents of a final display, are quite useless. Also, there is a problem that, after being delaminated from the glass base, it is difficult to handle a plurality of flexible displays which have no rigidity.

Such a problem is not limited to flexible displays which include OLEDs as light-emitting devices but can arise in producing a flexible light-emitting device which includes a micro LED (μLED) formed as a light-emitting device using inorganic semiconductor materials.

The present disclosure provides a method and apparatus for producing a flexible light-emitting device which are capable of solving the above-described problems.

Solution to Problem

A flexible light-emitting device production method of the present disclosure includes, in an exemplary embodiment, providing a multilayer stack which has a first surface and a second surface, the multilayer stack including a glass base which defines the first surface, a plurality of functional layer regions each including a TFT layer and a light-emitting device layer, a synthetic resin film provided between the glass base and the plurality of functional layer regions and bound to the glass base, the synthetic resin film including a plurality of flexible substrate regions respectively supporting the plurality of functional layer regions and an intermediate region surrounding the plurality of flexible substrate regions, and a protection sheet which covers the plurality of functional layer regions and which defines the second surface, dividing the intermediate region and respective ones of the plurality of flexible substrate regions of the synthetic resin film from one another, irradiating an interface between the synthetic resin film and the glass base with lift-off light, and separating the multilayer stack into a first portion and a second portion by increasing a distance from a stage to the glass base while the second surface of the multilayer stack is kept in contact with the stage, wherein the first portion of the multilayer stack includes a plurality of light-emitting devices which are in contact with the stage, and the plurality of light-emitting devices respectively include the plurality of functional layer regions and include the plurality of flexible substrate regions of the synthetic resin film, the second portion of the multilayer stack includes the glass base and the intermediate region of the synthetic resin film, irradiating the interface between the plurality of flexible substrate regions of the synthetic resin film and the glass base with the lift-off light includes first light scanning for scanning the interface in a first direction parallel to the interface with the lift-off light in the form of a line beam which is transverse to the first direction, and second light scanning for scanning the interface in a second direction which is parallel to the interface and different from the first direction with the lift-off light in the form of a line beam which is transverse to the second direction, and in each of the first and second light scanning, an irradiation intensity of the lift-off light is modulated such that an irradiation intensity of the lift-off light for at least part of an interface between the intermediate region of the synthetic resin film and the glass base is lower than an irradiation intensity of the lift-off light for the interface between the plurality of flexible substrate regions of the synthetic resin film and the glass base.

In one embodiment, the lift-off light is incoherent light.

In one embodiment, the light-emitting device layer includes a plurality of arrayed micro LEDs, and the lift-off light is laser light.

In one embodiment, in each of the first and second light scanning, an irradiation intensity of the lift-off light is lower than a threshold level which is necessary for delaminating the plurality of flexible substrate regions of the synthetic resin film from the glass base through a single scanning cycle, and a sum of irradiation intensities of the lift-off light in the first and second light scanning is higher than the threshold level.

In one embodiment, providing the multilayer stack includes providing a delamination layer between the glass base and the synthetic resin film.

In one embodiment, the delamination layer is made of a metal or a semiconductor.

In one embodiment, the lift-off light is a line beam extending in a direction parallel to a peripheral edge of the glass base, and irradiating the interface between the synthetic resin film and the glass base with the lift-off light includes moving an irradiation region on the interface which is to be irradiated with the lift-off light in another direction which is transverse to an extending direction of the line beam.

In one embodiment, the at least part of the interface between the intermediate region of the synthetic resin film and the glass base includes two parallel stripe regions extending along the peripheral edge of the glass base.

In one embodiment, the at least part of the interface between the intermediate region of the synthetic resin film and the glass base includes at least one middle stripe region which is parallel to the stripe regions.

In one embodiment, the at least part of the interface between the intermediate region of the synthetic resin film and the glass base has a width which is not less than 50% of a width of the intermediate region.

In one embodiment, the at least part of the interface between the intermediate region of the synthetic resin film and the glass base has a width which is not less than 1 mm.

In one embodiment, the method further includes, after separating the multilayer stack into the first portion and the second portion, sequentially or concurrently performing a process on the plurality of light-emitting devices which are in contact with the stage.

In one embodiment, the process includes any of attaching a dielectric and/or electrically-conductive film to each of the plurality of light-emitting devices, cleaning or etching each of the plurality of light-emitting devices, and mounting an optical part and/or an electronic part to each of the plurality of light-emitting devices.

A flexible light-emitting device production apparatus of the present disclosure includes, in an exemplary embodiment, a stage for supporting a multilayer stack which has a first surface and a second surface, the multilayer stack including a glass base which defines the first surface, a plurality of functional layer regions each including a TFT layer and a light-emitting device layer, a synthetic resin film provided between the glass base and the plurality of functional layer regions and bound to the glass base, the synthetic resin film including a plurality of flexible substrate regions respectively supporting the plurality of functional layer regions and an intermediate region surrounding the plurality of flexible substrate regions, and a protection sheet which covers the plurality of functional layer regions and which defines the second surface, the intermediate region and respective ones of the plurality of flexible substrate regions of the synthetic resin film being divided from one another, and a lift-off light irradiation unit for irradiating with lift-off light an interface between the synthetic resin film and the glass base in the multilayer stack supported by the stage, wherein the lift-off light irradiation unit includes first light scanning for scanning the interface in a first direction parallel to the interface with the lift-off light in the form of a line beam which is transverse to the first direction, and second light scanning for scanning the interface in a second direction which is parallel to the interface and different from the first direction with the lift-off light in the form of a line beam which is transverse to the second direction, and in each of the first and second light scanning, an irradiation intensity of the lift-off light is modulated such that an irradiation intensity of the lift-off light for at least part of an interface between the intermediate region of the synthetic resin film and the glass base is lower than an irradiation intensity of the lift-off light for the interface between the plurality of flexible substrate regions of the synthetic resin film and the glass base.

In one embodiment, the lift-off light irradiation unit comprises an incoherent light source.

In one embodiment, the light-emitting device layer includes a plurality of arrayed micro LEDs, and the lift-off light irradiation unit comprises a laser light source.

In one embodiment, in each of the first and second light scanning, an irradiation intensity of the lift-off light is lower than a threshold level which is necessary for delaminating the plurality of flexible substrate regions of the synthetic resin film from the glass base through a single scanning cycle, and a sum of irradiation intensities of the lift-off light in the first and second light scanning is higher than the threshold level.

In one embodiment, the apparatus further includes an actuator for increasing a distance from the stage to the glass base while the stage is kept in contact with the second surface of the multilayer stack, thereby separating the multilayer stack into a first portion and a second portion, wherein the first portion of the multilayer stack includes a plurality of light-emitting devices which are in contact with the stage, and the plurality of light-emitting devices respectively include the plurality of functional layer regions and include the plurality of flexible substrate regions of the synthetic resin film, and the second portion of the multilayer stack includes the glass base and the intermediate region of the synthetic resin film.

Advantageous Effects of Invention

According to an embodiment of the present invention, a novel method for producing a flexible light-emitting device which is capable of solving the above-described problems is provided.

DESCRIPTION OF EMBODIMENTS

An embodiment of a method and apparatus for producing a flexible light-emitting device of the present disclosure is described with reference to the drawings. Examples of the "light-emitting device" include displays and illumination devices. In the following description, unnecessarily detailed description will be omitted. For example, detailed description of well-known matter and repetitive description of substantially identical elements will be omitted. This is for the purpose of avoiding the following description from being unnecessarily redundant and assisting those skilled in the art to easily understand the description. The present inventors provide the attached drawings and the following description for the purpose of assisting those skilled in the art to fully understand the present disclosure. Providing these drawings and description does not intend to limit the subject matter recited in the claims.

<Multilayer Stack>

Figure 1A:
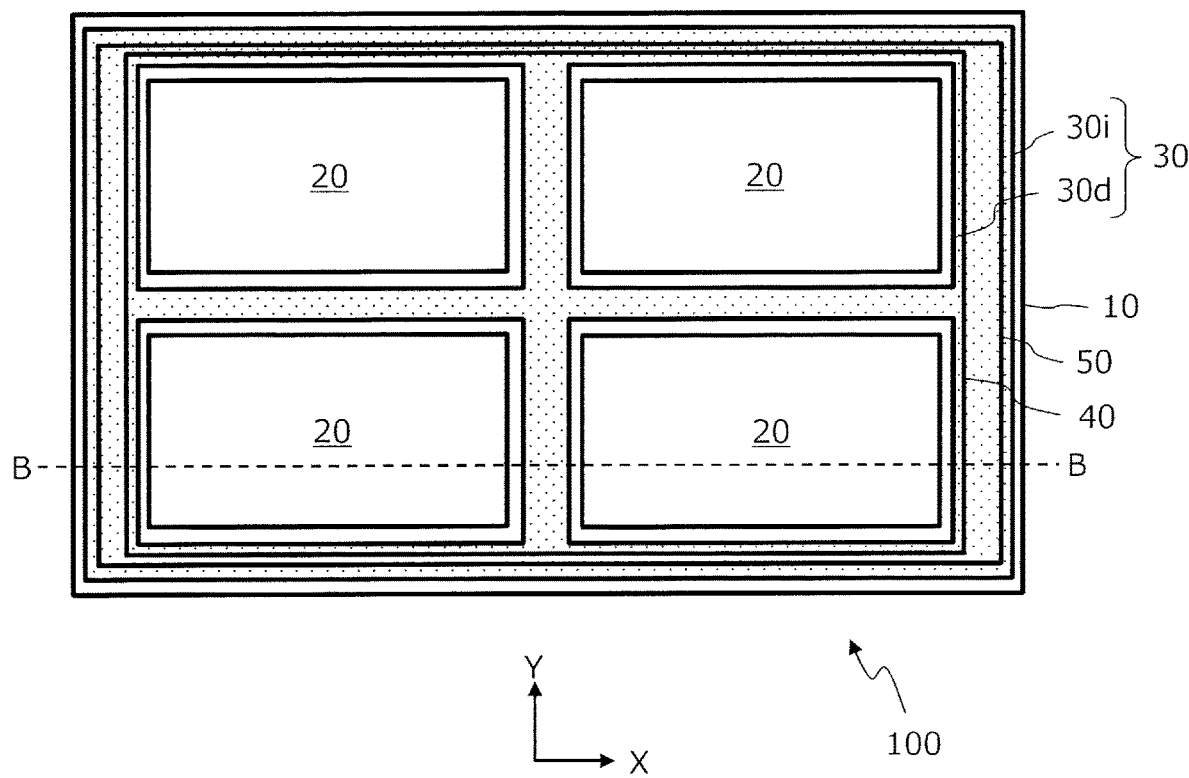
FIG. 1A is a plan view showing a configuration example of a multilayer stack used in a flexible light-emitting device production method of the present disclosure.
Figure 1B:
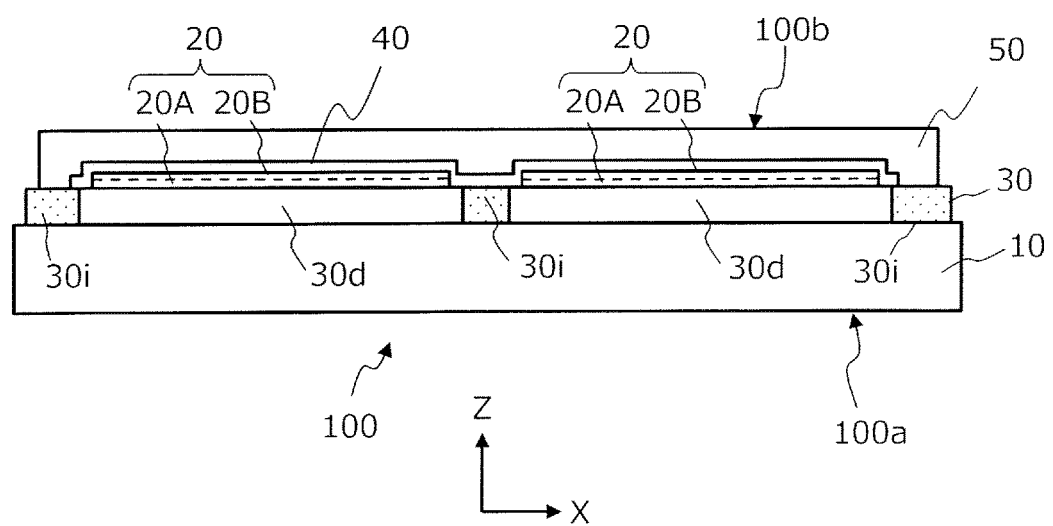
FIG. 1B is a cross-sectional view of the multilayer stack taken along line B-B of FIG. 1A.

See FIG. 1A and FIG. 1B. In a flexible light-emitting device production method of the present embodiment, firstly, a multilayer stack 100 illustrated in FIG. 1A and FIG. 1B is provided. FIG. 1A is a plan view of the multilayer stack 100. FIG. 1B is a cross-sectional view of the multilayer stack 100 taken along line B-B of FIG. 1A. In FIG. 1A and FIG. 1B, an XYZ coordinate system with X-axis, Y-axis and Z-axis, which are perpendicular to one another, is shown for reference.

The multilayer stack 100 includes a glass base (motherboard or carrier) 10, a plurality of functional layer regions 20 each including a TFT layer 20A and a light-emitting device layer 20B, a synthetic resin film (hereinafter, simply referred to as "plastic film") 30 provided between the glass base 10 and the plurality of functional layer regions 20 and bound to the glass base 10, and a protection sheet 50 covering the plurality of functional layer regions 20. The multilayer stack 100 further includes a gas barrier film 40 provided between the plurality of functional layer regions 20 and the protection sheet 50 so as to cover the entirety of the functional layer regions 20. The multilayer stack 100 may include another unshown layer, such as a buffer layer.

In the present embodiment, the light-emitting device layer 20B includes, for example, a plurality of OLED devices which are two-dimensionally arrayed. In the present disclosure, the "light-emitting device layer" refers to a two-dimensional array of light-emitting devices. Each of the light-emitting devices is not limited to an OLED device but may be a micro LED device. In the present embodiment, a typical example of the flexible light-emitting device is a "flexible display" but may be a "flexible illumination device".

The first surface 100a of the multilayer stack 100 is defined by the glass base 10. The second surface 100b of the multilayer stack 100 is defined by the protection sheet 50. The glass base 10 and the protection sheet 50 are materials temporarily used in the production process but are not constituents of a final flexible light-emitting device.

The plastic film 30 shown in the drawings includes a plurality of flexible substrate regions 30d respectively supporting the plurality of functional layer regions 20, and an intermediate region 30i surrounding each of the flexible substrate regions 30d. The flexible substrate regions 30d and the intermediate region 30i are merely different portions of a single continuous plastic film 30 and do not need to be physically distinguished. In other words, regions of the plastic film 30 lying immediately under respective ones of the functional layer regions 20 are the flexible substrate regions 30d, and the other region of the plastic film 30 is the intermediate region 30i.

Each of the plurality of functional layer regions 20 is a constituent of a final flexible light-emitting device (e.g., display panel). In other words, the multilayer stack 100 has such a structure that a plurality of flexible light-emitting devices which are not yet divided from one another are supported by a single glass base 10. Each of the functional layer regions 20 has such a shape that, for example, the thickness (size in Z-axis direction) is several tens of micrometers, the length (size in X-axis direction) is about 12 cm, and the width (size in Y-axis direction) is about 7 cm. These sizes can be set to arbitrary values according to the required largeness of the display screen or emission surface region. The shape in the XY plane of each of the functional layer regions 20 is rectangular in the example illustrated in the drawings but is not limited to this example. The shape in the XY plane of each of the functional layer regions 20 may include a square, a polygon, or a shape which includes a curve in the contour.

As shown in FIG. 1A, the flexible substrate regions 30d are two-dimensionally arrayed in rows and columns according to the arrangement of the flexible light-emitting devices. The intermediate region 30i consists of a plurality of stripes perpendicular to one another and forms a grid pattern. The width of the stripes is, for example, about 1-4 mm. The flexible substrate region 30d of the plastic film 30 functions as the "flexible substrate" in each flexible light-emitting device which is in the form of a final product. Meanwhile, the intermediate region 30i of the plastic film 30 is not a constituent of the final product.

In an embodiment of the present disclosure, the configuration of the multilayer stack 100 is not limited to the example illustrated in the drawings. The number of functional layer regions 20 supported by a single glass base 10 is arbitrary.

The size or proportion of each component illustrated in respective drawings is determined from the viewpoint of understandability. The actual size or proportion is not necessarily reflected in the drawings.

Figure 1C:
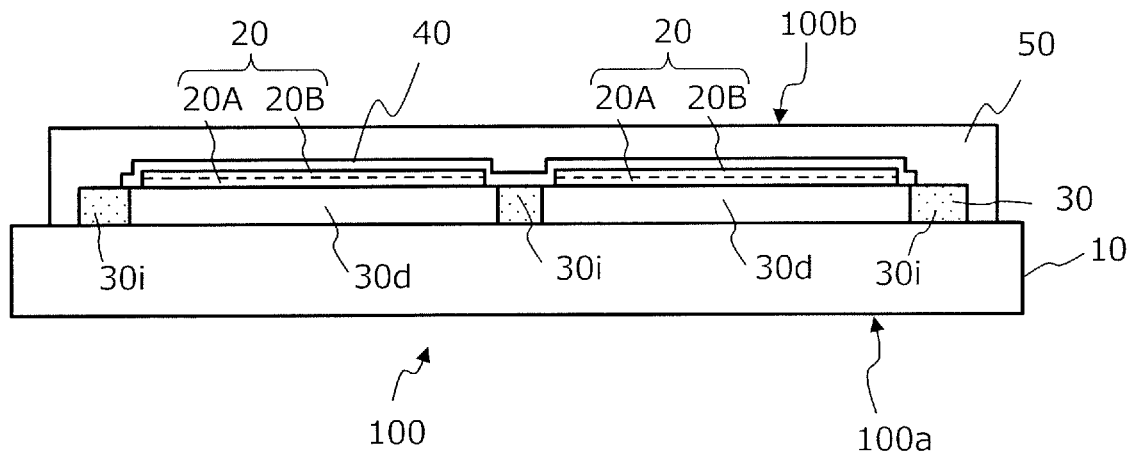
FIG. 1C is a cross-sectional view showing another example of the multilayer stack.
Figure 1D:
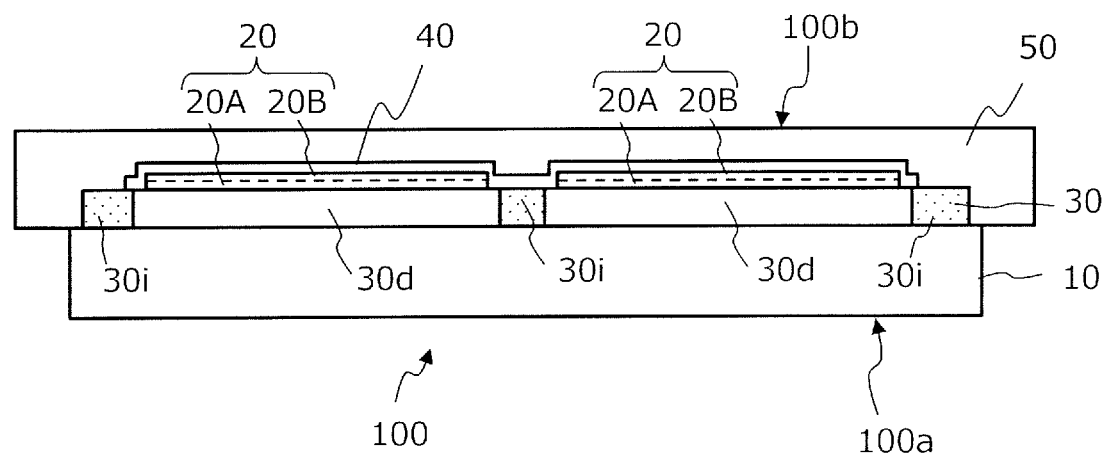
FIG. 1D is a cross-sectional view showing still another example of the multilayer stack.

The multilayer stack 100 which can be used in the production method of the present disclosure is not limited to the example illustrated in FIG. 1A and FIG. 1B. FIG. 1C and FIG. 1D are cross-sectional views showing other examples of the multilayer stack 100. In the example illustrated FIG. 1C, the protection sheet 50 covers the entirety of the plastic film 30 and extends outward beyond the plastic film 30. In the example illustrated FIG. 1D, the protection sheet 50 covers the entirety of the plastic film 30 and extends outward beyond the glass base 10. As will be described later, after the glass base 10 is separated from the multilayer stack 100, the multilayer stack 100 is a thin flexible sheet-like structure which has no rigidity. The protection sheet 50 serves to protect the functional layer regions 20 from impact and abrasion when the functional layer regions 20 collide with or come into contact with external apparatuses or instruments in the step of delaminating the glass base 10 and the steps after the delaminating. Since the protection sheet 50 is peeled off from the multilayer stack 100 in the end, a typical example of the protection sheet 50 has a laminate structure which includes an adhesive layer of a relatively small adhesive force (a layer of an applied mold-releasing agent) over its surface. The more detailed description of the multilayer stack 100 will be described later.

<Dividing Of Light-Emitting Devices>

According to the flexible light-emitting device production method of the present embodiment, after the step of providing the above-described multilayer stack 100, the step of dividing an intermediate region 30i and respective ones of a plurality of flexible substrate regions 30d of the plastic film 30 from one another is carried out.

Figure 2:
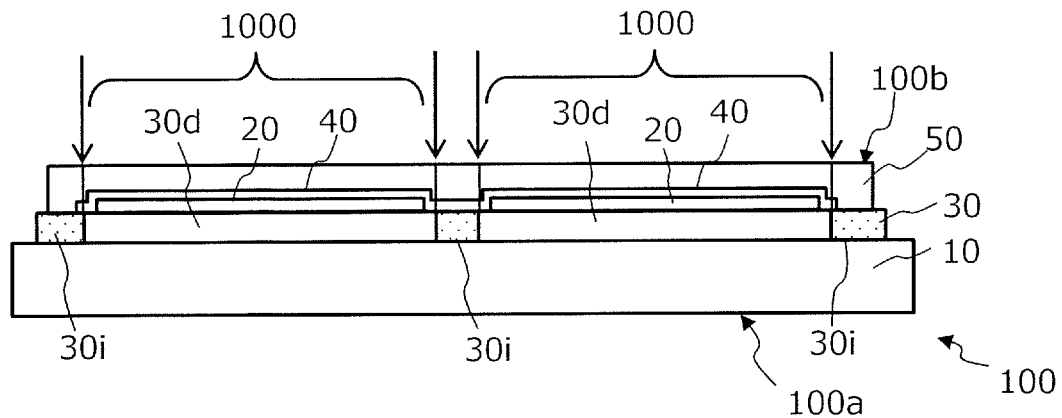
FIG. 2 is a cross-sectional view schematically showing the dividing positions in the multilayer stack.

FIG. 2 is a cross-sectional view schematically showing the positions for dividing the intermediate region 30i and respective ones of the plurality of flexible substrate regions 30d of the plastic film 30 from one another. The positions of irradiation extend along the periphery of each of the flexible substrate regions 30d. In FIG. 2, the positions indicated by arrows are irradiated with a laser beam for cutting. Part of the multilayer stack 100 exclusive of the glass base 10 is cut into a plurality of light-emitting devices (e.g., display panels) 1000 and the remaining unnecessary portions. By cutting, a gap of several tens of micrometers to several hundreds of micrometers is formed between each of the light-emitting devices 1000 and a portion surrounding the light-emitting device 1000. The cutting can also be realized by a cutter which has a fixed blade or a rotary blade instead of the laser beam irradiation. After the cutting, the light-emitting devices 1000 and the remaining unnecessary portions are still bound to the glass base 10.

When the cutting is realized by a laser beam, the wavelength of the laser beam may be in any of the infrared, visible and ultraviolet bands. From the viewpoint of reducing the effect of the cutting on the glass base 10, the laser beam desirably has a wavelength in the range of green to ultraviolet. For example, when a Nd:YAG laser apparatus is used, the cutting can be carried out using a second harmonic wave (wavelength: 532 nm) or a third harmonic wave (wavelength: 343 nm or 355 nm). In such a case, the laser power is adjusted to 1 to 3 watts, and the scanning rate is set to about 500 mm per second, so that the multilayer structure supported by the glass base 10 can be cut (divided) into light-emitting devices and unnecessary portions without damaging the glass base 10.

According to the embodiment of the present disclosure, the timing of the above-described cutting is earlier than in the prior art. Since the cutting is carried out while the plastic film 30 is bound to the glass base 10, alignment for the cutting can be made with high precision and accuracy even if the gap between adjoining light-emitting devices 1000 is narrow. Thus, the gap between adjoining light-emitting devices 1000 can be shortened, and accordingly, useless portions which are unnecessary for a final product can be reduced. In the prior art, after the delaminating from the glass base 10, a polarizer, a heat radiation sheet, and/or an electromagnetic shield can be adhered to the plastic film 30 so as to cover the entirety of the surface (delaminated surface) of the plastic film 30. In such a case, the polarizer, the heat radiation sheet, and/or the electromagnetic shield are also divided by cutting into portions covering the light-emitting devices 1000 and the remaining unnecessary portions. The unnecessary portions are disposed of as waste. On the other hand, according to the production method of the present disclosure, production of such waste can be suppressed as will be described later.

<Lift-Off Light Irradiation>

After the intermediate region 30i and respective ones of the plurality of flexible substrate regions 30d of the plastic film 30 are divided from one another, the step of irradiating the interface between the flexible substrate regions 30d of the plastic film 30 and the glass base 10 with laser light is carried out using a lift-off light irradiation unit.

Figure 3A:
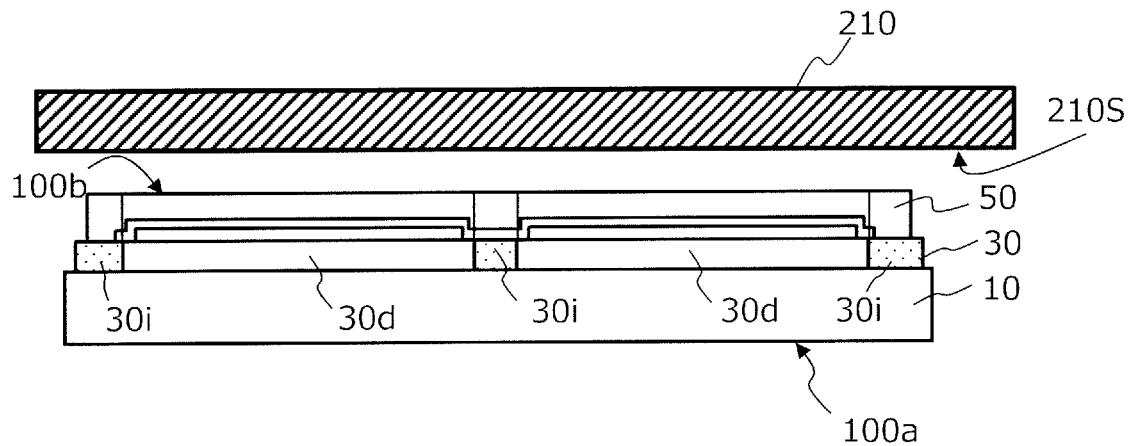
FIG. 3A is a diagram schematically showing a state immediately before a stage supports a multilayer stack.

FIG. 3A schematically shows a state immediately before the stage 210 supports the multilayer stack 100. In the present embodiment, the stage 210 is a chuck stage which has a large number of pores in the surface for suction. The multilayer stack 100 is arranged such that the second surface 100b of the multilayer stack 100 faces the surface 210S of the stage 210, and is supported by the stage 210.

Figure 3B:
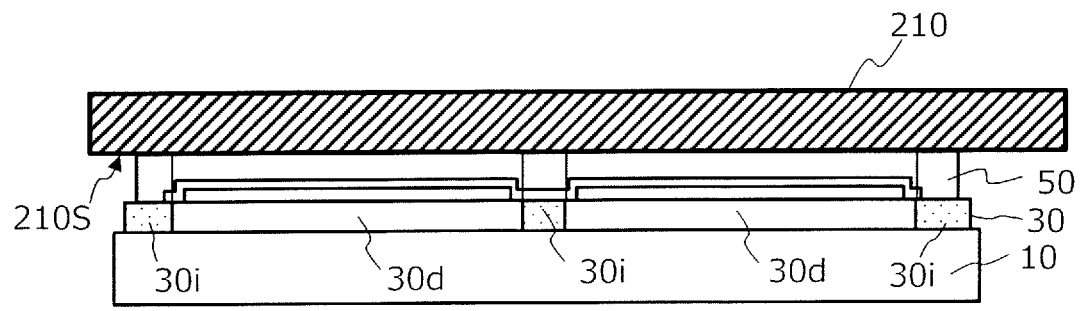
FIG. 3B is a diagram schematically showing a state where the stage supports the multilayer stack.

FIG. 3B schematically shows a state where the stage 210 supports the multilayer stack 100. The arrangement of the stage 210 and the multilayer stack 100 is not limited to the example illustrated in the drawing. For example, the multilayer stack 100 may be placed upside down such that the stage 210 is present under the multilayer stack 100.

In the example illustrated in FIG. 3B, the multilayer stack 100 is in contact with the surface 210S of the stage 210, and the stage 210 holds the multilayer stack 100 by suction.

Figure 3C:
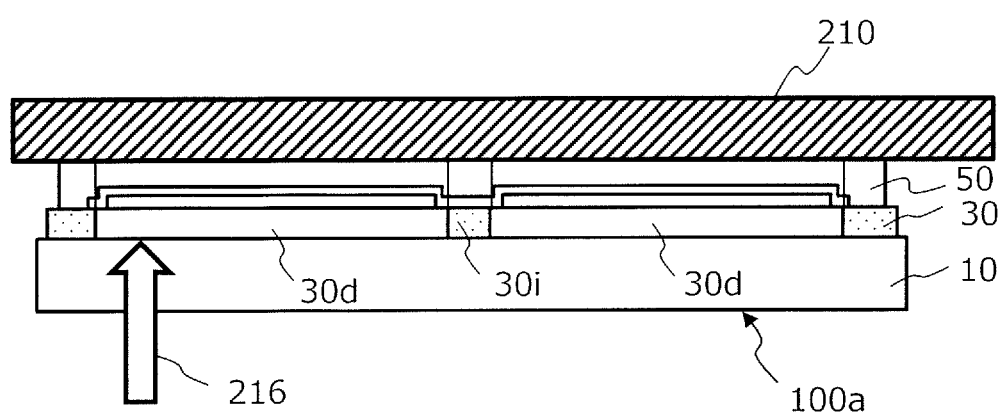
FIG. 3C is a diagram schematically showing that the interface between a glass base and a plastic film of the multilayer stack with lift-off light.

Then, as shown in FIG. 3C, the interface between the plastic film 30 and the glass base 10 is irradiated with lift-off light 216. FIG. 3C schematically illustrates irradiation of the interface between the glass base 10 and the plastic film 30 of the multilayer stack 100 with the lift-off light 216 in the shape of a line extending in a direction vertical to the sheet of the drawing. A part of the plastic film 30 at the interface between the glass base 10 and the plastic film 30 absorbs the lift-off light 216 and decomposes (disappears). By scanning the above-described interface with the lift-off light 216, the degree of binding of the plastic film 30 to the glass base 10 is reduced. The wavelength of the lift-off light 216 is typically in the ultraviolet band. The wavelength of the lift-off light 216 is selected such that the lift-off light 216 is hardly absorbed by the glass base 10 but is absorbed by the plastic film 30 as much as possible. The light absorption by the glass base 10 is, for example, about 10% in the wavelength range of 343-355 nm but can increase to 30-60% at 308 nm.

Hereinafter, lift-off light irradiation according to the present embodiment is described in detail.

<Lift-Off Light Irradiation Unit 1>

In the present embodiment, the lift-off light irradiation unit includes a line beam source for emitting the lift-off light 216. The line beam source includes a laser apparatus and an optical system for shaping laser light emitted from the laser apparatus into a line beam. In the present disclosure, the lift-off light irradiation unit is referred to as "delaminating apparatus".

Figure 4A:
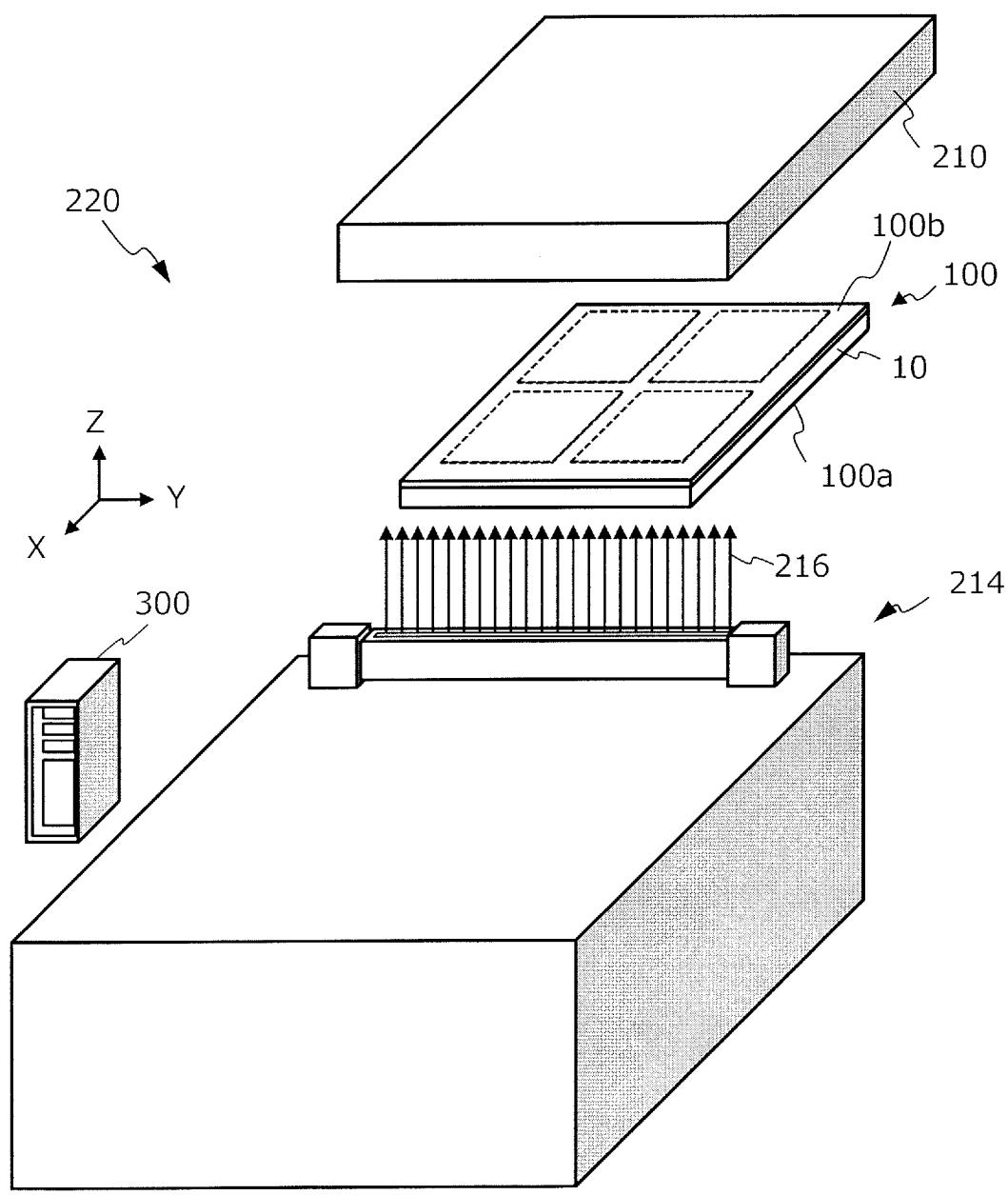
FIG. 4A is a perspective view schematically showing irradiation of the multilayer stack with a line beam emitted from a line beam source of a delaminating apparatus.

FIG. 4A is a perspective view schematically showing irradiation of the multilayer stack 100 with a line beam (lift-off light 216) emitted from a line beam source 214 of a delaminating apparatus 220. For the sake of understandability, the stage 210, the multilayer stack 100 and the line beam source 214 are shown as being spaced away from one another in the Z-axis direction of the drawing. During irradiation with the lift-off light 216, the second surface 100b of the multilayer stack 100 is in contact with the stage 210.

The delaminating apparatus 220 includes a controller 300 for controlling the operation of the line beam source 214 and the stage 210. The controller 300 changes the irradiation intensity of lift-off light emitted from the line beam source 214 according to the position of the stage 210. The controller 300 can be a general-purpose computer which has a known configuration. The controller 300 includes, for example, a microprocessor and a nonvolatile memory. In the nonvolatile memory, a program is stored which includes instructions to the microprocessor.

Figure 4B:
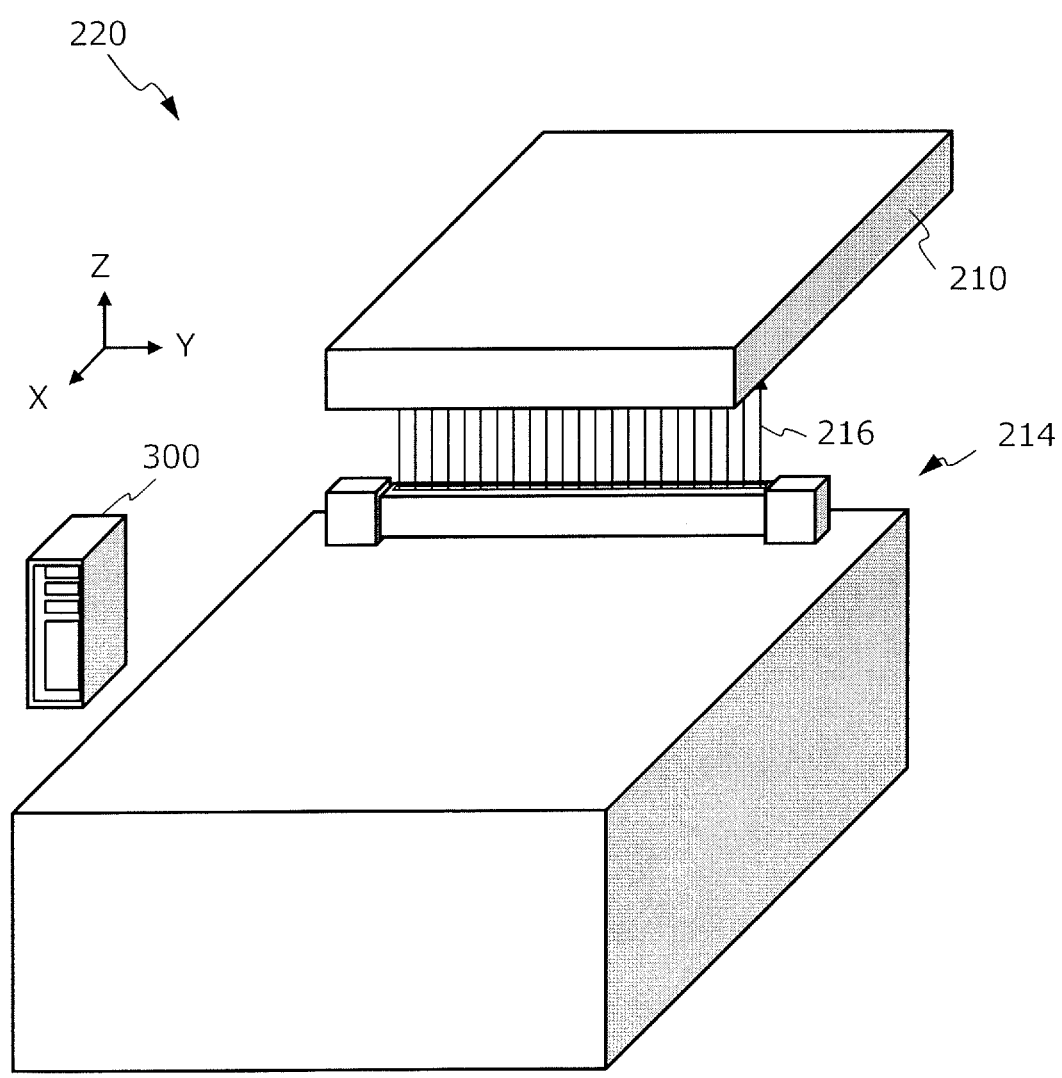
FIG. 4B is a perspective view schematically showing the position of the stage at the start of the first light scanning.

FIG. 4B schematically shows the position of the stage 210 during irradiation with the lift-off light 216 (at the start of the first light scanning). Although not shown in FIG. 4B, the multilayer stack 100 is supported by the stage 210.

Examples of the laser apparatus that emits the lift-off light 216 include gas laser apparatuses such as excimer laser, solid state laser apparatuses such as YAG laser, semiconductor laser devices, and other types of laser apparatuses. A XeCl excimer laser apparatus can generate laser light at the wavelength of 308 nm. When yttrium orthovanadate ($YVO_4$) doped with neodymium (Nd) or $YVO_4$ doped with ytterbium (Yb) is used as a lasing medium, the wavelength of laser light (fundamental wave) emitted from the lasing medium is about 1000 nm. Therefore, the fundamental wave can be converted by a wavelength converter to laser light at the wavelength of 340-360 nm (third harmonic wave) before it is used. Laser light in the shape of a spot beam emitted from these laser apparatuses is combined with an optical system consisting of lenses and prisms for reshaping the light into the shape of a line beam, whereby lift-off light 216 in the shape of a line beam is produced.

In the embodiment of the present disclosure, as will be described later, light scanning is carried out multiple times in different directions (first direction and second direction) relative to the multilayer stack 100. A sacrificial layer or delamination layer (a thin layer of a metal or amorphous silicon) may be provided at the interface between the plastic film 30 and the glass base 10. From the viewpoint of suppressing generation of ashes, using laser light at the wavelength of 308 nm from the excimer laser apparatus, rather than laser light at the wavelength of 340-360 nm, is more effective. Providing the sacrificial layer is highly effective in suppressing generation of ashes.

Figure 4C:
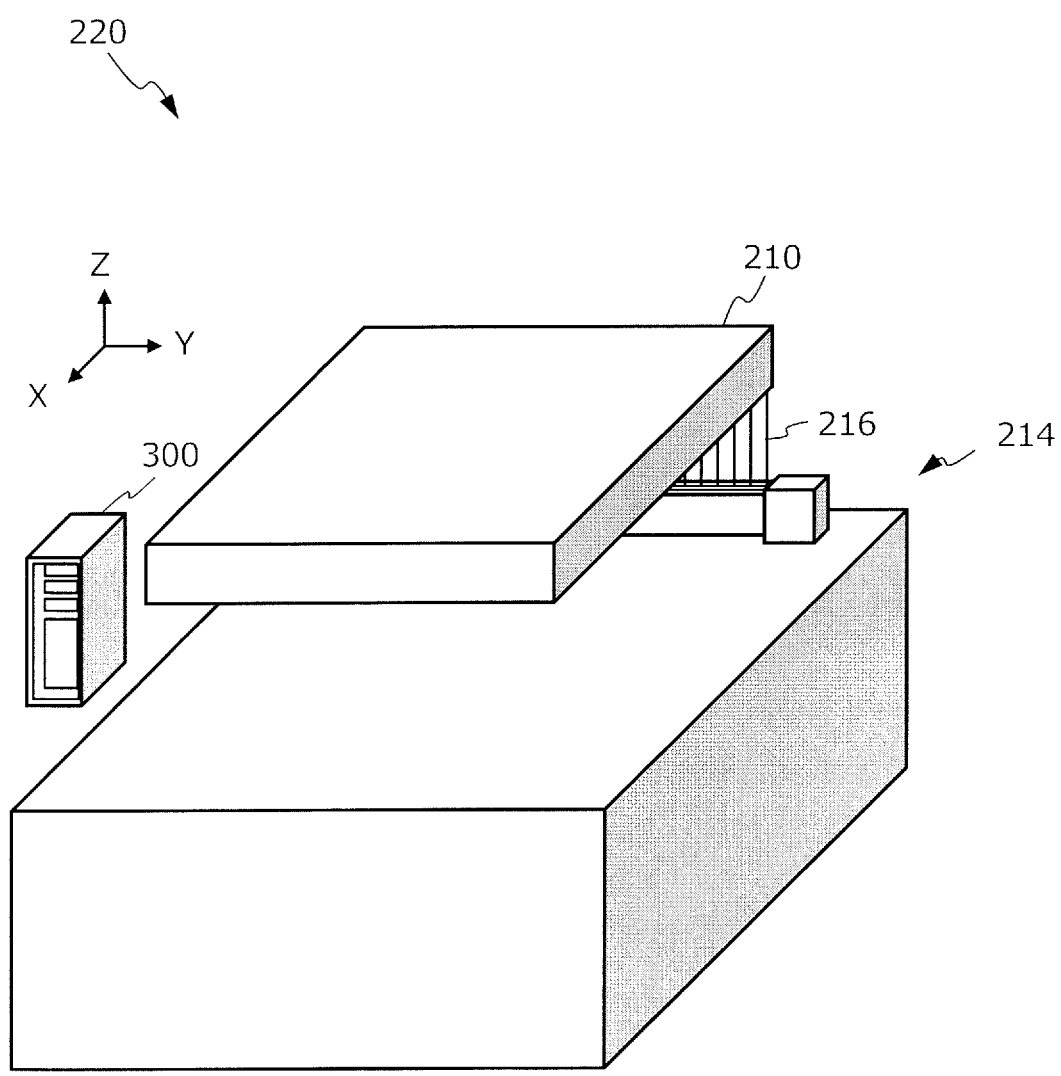
FIG. 4C is a perspective view schematically showing the position of the stage at the end of the first light scanning.

The position of irradiation with the lift-off light 216 moves relative to the glass base 10 for scanning with the lift-off light 216. In the delaminating apparatus 220, the multilayer stack 100 may be movable while the light source 214 from which the lift-off light is to be emitted and an optical unit (not shown) are stationary. Alternatively, the light source 214 may be movable while the multilayer stack 100 is stationary. In the present embodiment, irradiation with the lift-off light 216 is carried out during a period where the stage 210 moves from the position shown in FIG. 4B to the position shown in FIG. 4C. That is, scanning with the lift-off light 216 is carried out by movement of the stage 210 in the X-axis direction (first light scanning).

Figure 4D:
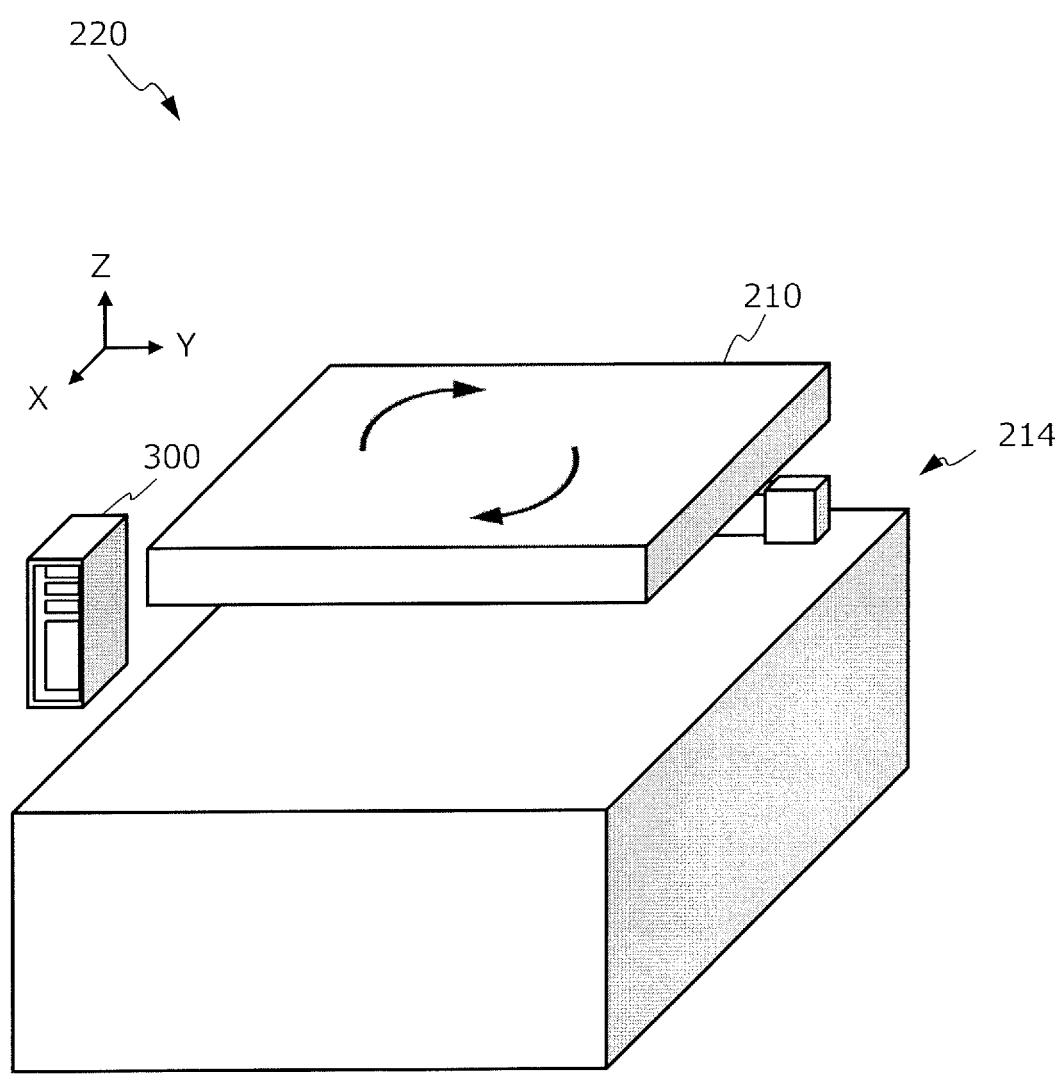
FIG. 4D is a perspective view schematically showing a multilayer stack with its orientation being rotated by 90° on an axis parallel to the Z-axis.
Figure 4E:
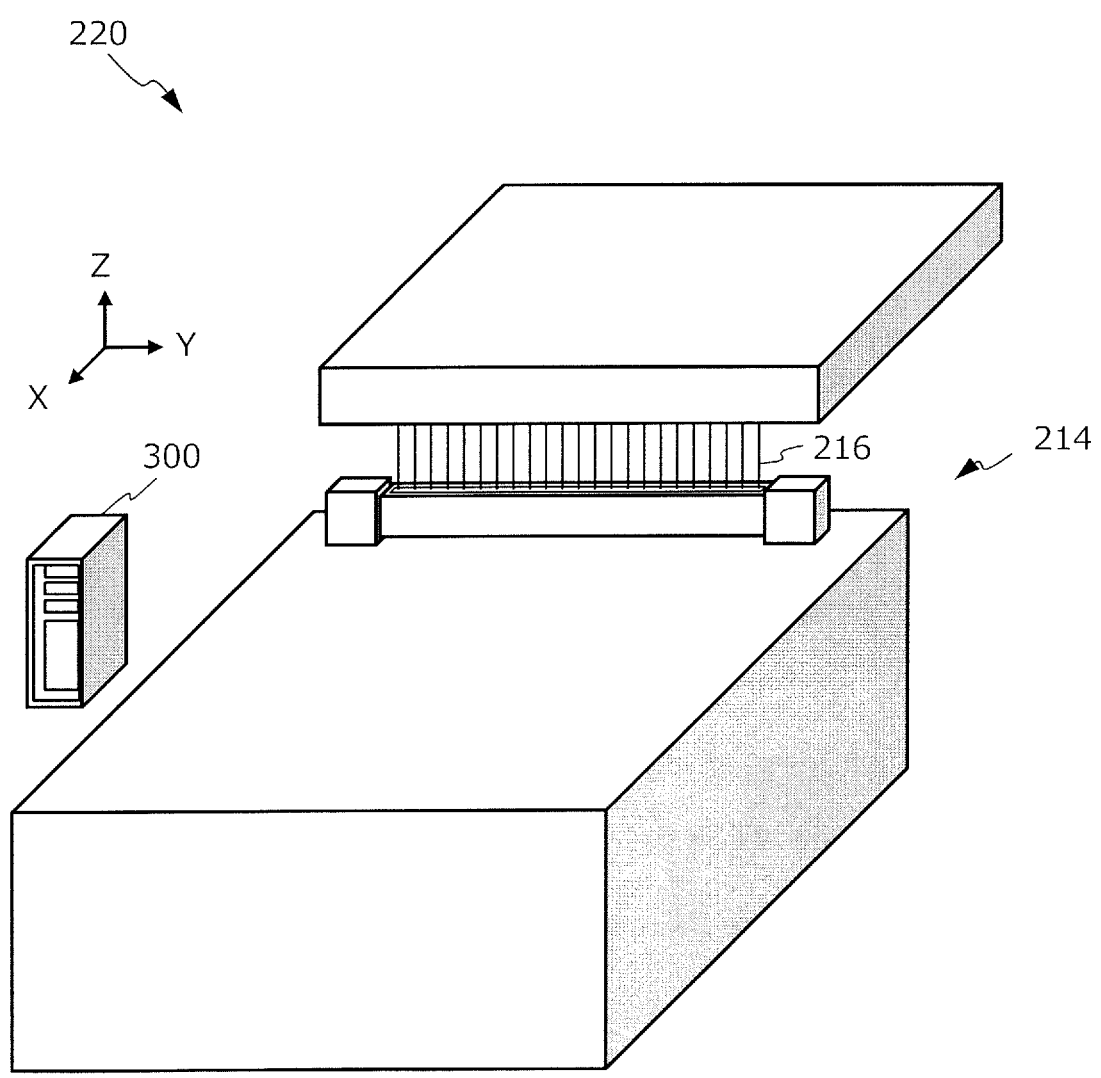
FIG. 4E is a perspective view schematically showing the position of the stage at the end of the second light scanning.

Then, as illustrated in FIG. 4D, the stage 210 rotates by 90° on an axis parallel to the Z-axis. Thereafter, as shown in FIG. 4E, the stage 210 is irradiated with the lift-off light 216 while moving in the negative direction of the X-axis (second light scanning). In each of the first and second light scanning, the irradiation intensity of laser light is modulated such that the irradiation intensity of laser light for at least part of the interface between the intermediate region 30i of the plastic film 30 and the glass base 10 is lower than the irradiation intensity of laser light for the interface between the plurality of flexible substrate regions 30d of the plastic film 30 and the glass base 10. In each of the first and second light scanning, the irradiation intensity of laser light is lower than a threshold level which is necessary for delamination at the interface between the plurality of flexible substrate regions 30d of the plastic film 30 and the glass base 10 through a single scanning cycle. However, the sum of the irradiation intensities of laser light in the first and second light scanning is higher than the threshold level. Hereinafter, details of these two light scanning cycles are described.

First, see FIG. 5A to FIG. 5D. FIG. 5A to FIG. 5D are perspective views schematically showing the scanning with the lift-off light 216. In these drawings, the direction of the Z-axis is opposite to the direction of the Z-axis of FIG. 4A to FIG. 4C.

Figure 5A:
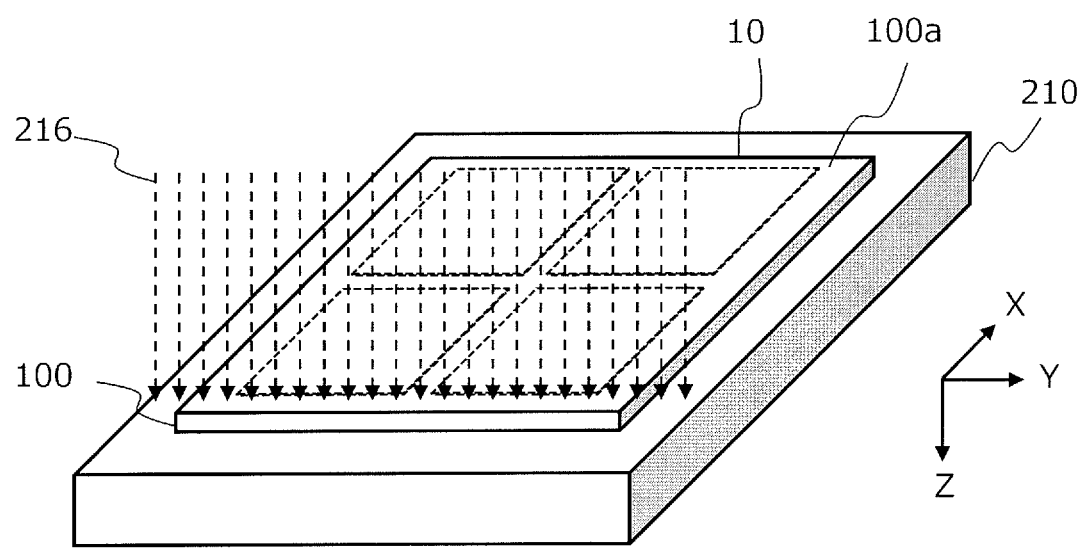
FIG. 5A is a perspective view schematically showing the first light scanning.
Figure 5B:
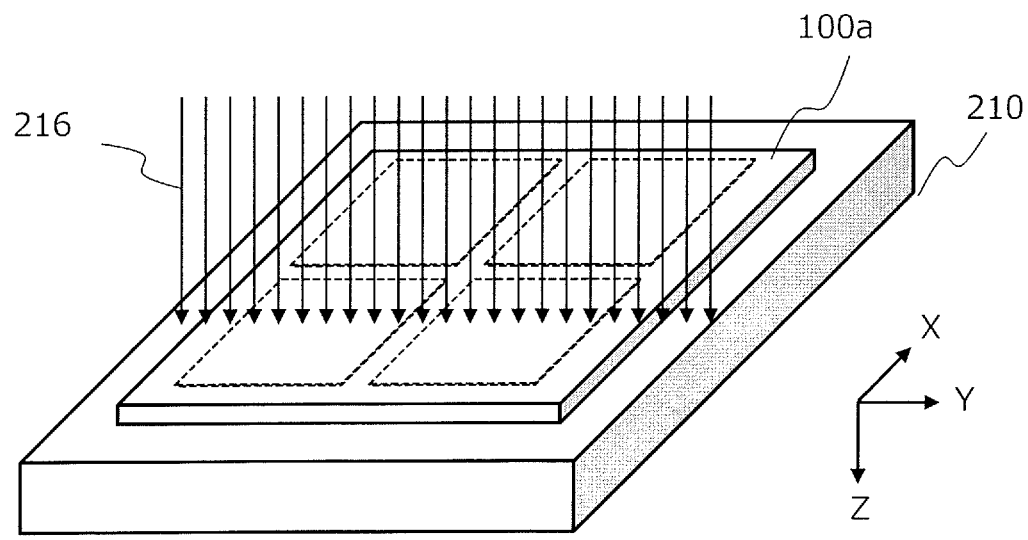
FIG. 5B is a perspective view schematically showing the first light scanning.
Figure 5C:
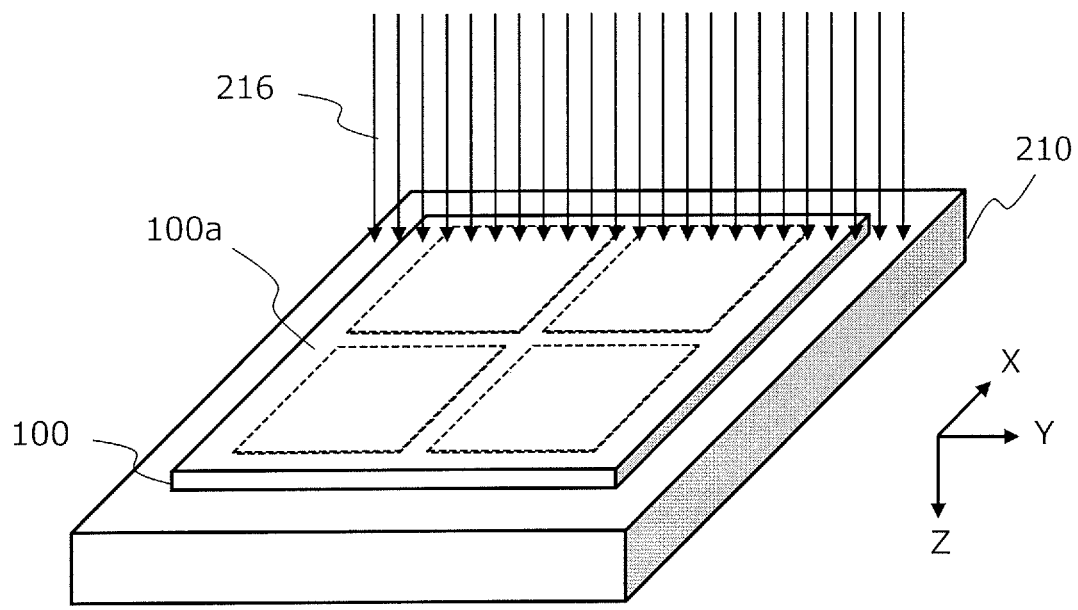
FIG. 5C is a perspective view schematically showing the first light scanning.
Figure 5D:
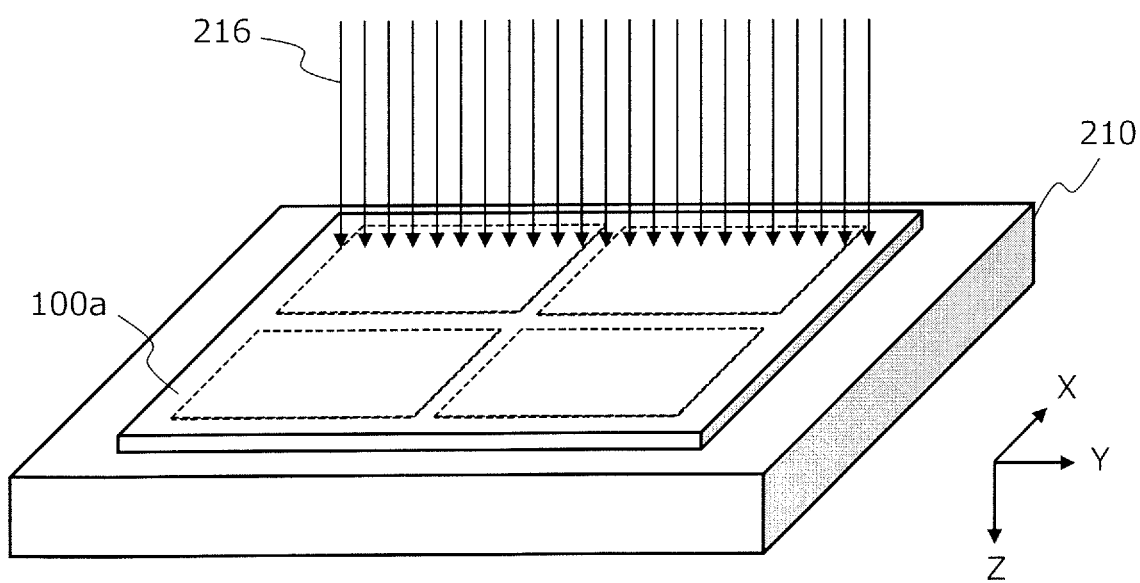
FIG. 5D is a perspective view schematically showing the second light scanning.

In FIG. 5A, the rays of the lift-off light 216 are represented by broken line arrows. In FIG. 5B to FIG. 5D, the rays of the lift-off light 216 are represented by solid line arrows. The broken line arrows represent rays whose irradiation intensity s relatively low as compared with the solid line arrows. The state of FIG. 5D corresponds to the state of FIG. 4D. The stage 210 of FIG. 5D results from rotation of the stage 210 of FIG. 5C by 90° on an axis parallel to the Z-axis. In the present embodiment, scanning with the lift-off light 216 is first carried out along the longer side of the multilayer stack 100 and then carried out along the shorter side of the multilayer stack 100. Such an order is arbitrary.

In the present embodiment, the lift-off light 216 is a line beam extending in a direction parallel to the peripheral edge of the glass base 10 (in this example, the Y-axis direction). This line beam is emitted from the line beam source 214 shown in FIG. 4A and other drawings. The irradiation position of the lift-off light 216 on the multilayer stack 100 can be moved not only in the positive direction of the X-axis but also in the negative direction of the X-axis with the passage of time as shown in FIG. 5A, FIG. 5B, FIG. 5C and FIG. 5D.

Figure 6:
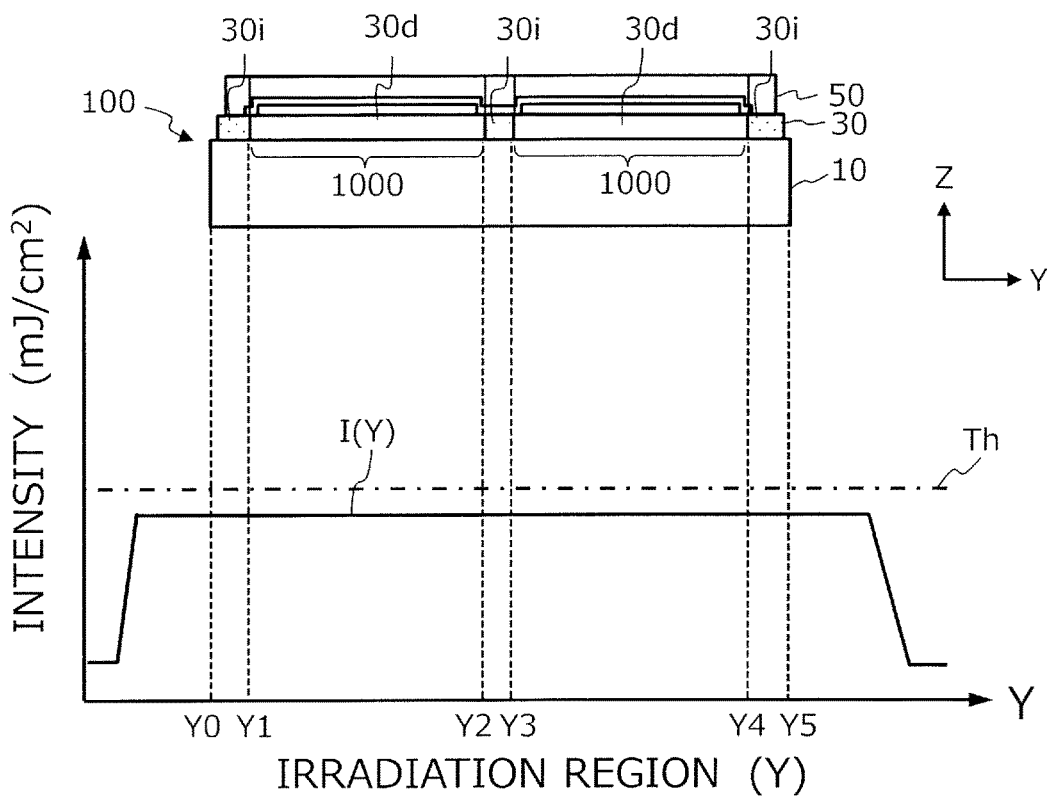
FIG. 6 is a diagram schematically showing an example of the distribution in the Y-axis direction of the irradiation intensity of the lift-off light in the first light scanning.

Next, see FIG. 6. FIG. 6 is a diagram schematically showing an example of the distribution in the Y-axis direction of the irradiation intensity of the lift-off light 216. In the graph of FIG. 6, the horizontal axis represents the Y-axis coordinate of the irradiation region, and the vertical axis represents the irradiation intensity. The irradiation intensity is expressed by the energy density per unit area (e.g., [$mJ/cm^2$]). In the graph of FIG. 6, specific values of the irradiation intensity are not shown. The irradiation intensity refers to a value in the range of, for example, not less than 0 $mJ/cm^2$ and not more than 500 $mJ/cm^2$. In the graph of FIG. 6, a solid line represents the Y-axis direction distribution I(Y) of the irradiation intensity, and a dot-chain line represents threshold level Th of the irradiation intensity which is necessary for delamination. In the present disclosure, the "threshold level" means a level at which the plastic film 30 sufficiently delaminates from the glass base 10. Threshold level Th is, for example, 250-300 $mJ/cm^2$. When a sacrificial layer is provided between the plastic film 30 and the glass base 10, threshold level Th can be increased to, for example, 300-600 $mJ/cm^2$. Finally, in a region irradiated with lift-off light at an irradiation intensity lower than this threshold level Th, the amount of lift-off light absorbed by the plastic film 30 is insufficient. Therefore, the plastic film 30 in that region remains bound, without being delaminated from the glass base 10.

According to the present embodiment, the irradiation intensity does not exceed threshold level Th at any position through a single light scanning cycle.

In FIG. 6, a cross section of the multilayer stack 100 which is parallel to the YZ plane is shown above the graph for reference. The glass base 10 extends from position Y0 to position Y5. The light-emitting device 1000 on the left-hand side resides in the region extending from position Y1 to position Y2. The light-emitting device 1000 on the right-hand side resides in the region extending from position Y3 to position Y4. In other words, the flexible substrate regions 30d of the plastic film 30 correspond to the region extending from position Y1 to position Y2 and the region extending from position Y3 to position Y4. Meanwhile, the intermediate region 30i of the plastic film 30 corresponds to the region extending from position Y0 to position Y1, the region extending from position Y2 to position Y3, and the region extending from position Y4 to position Y5.

In the example of FIG. 6, the irradiation intensity distribution I(Y) of the lift-off light is, for example, in a range of 50% to 98% of threshold level Th in a region larger than the region extending from position Y0 to position Y5. In the present embodiment, the lift-off light is a line beam which is longer than the size in the Y-axis direction of the glass base 10. The irradiation intensity of the line beam achieved through a single scanning cycle is insufficient for delamination. The smallest value of the irradiation intensity distribution I(Y) of the lift-off light during the scanning is, for example, 0 mJ/cm² but may be greater than 0 mJ/cm² (e.g., 20-130 mJ/cm²). It is only required that the sum of the irradiation intensities achieved through two lift-off light irradiation cycles does not reach a level which is necessary for delaminating the intermediate region 30$i$ of the plastic film 30 from the glass base 10.

In the example of FIG. 6, the irradiation intensity distribution I(Y) of the lift-off light is linear although the embodiment of the present disclosure is not limited to such an example. For example, as in the example illustrated in FIG. 7, a part or the entirety of the irradiation intensity distribution I(Y) of the lift-off light may be curved. When an amorphous semiconductor is heated and crystallized by irradiation with laser light in the shape of a line beam, the irradiation intensity distribution is desired to be uniform in order to achieve uniform crystallinity. On the other hand, when the delamination in the present embodiment is carried out, the line beam does not need to be uniform so long as the irradiation intensity of the lift-off light at the interface which needs delamination exceeds threshold level Th after two scanning cycles.

Figure 8:
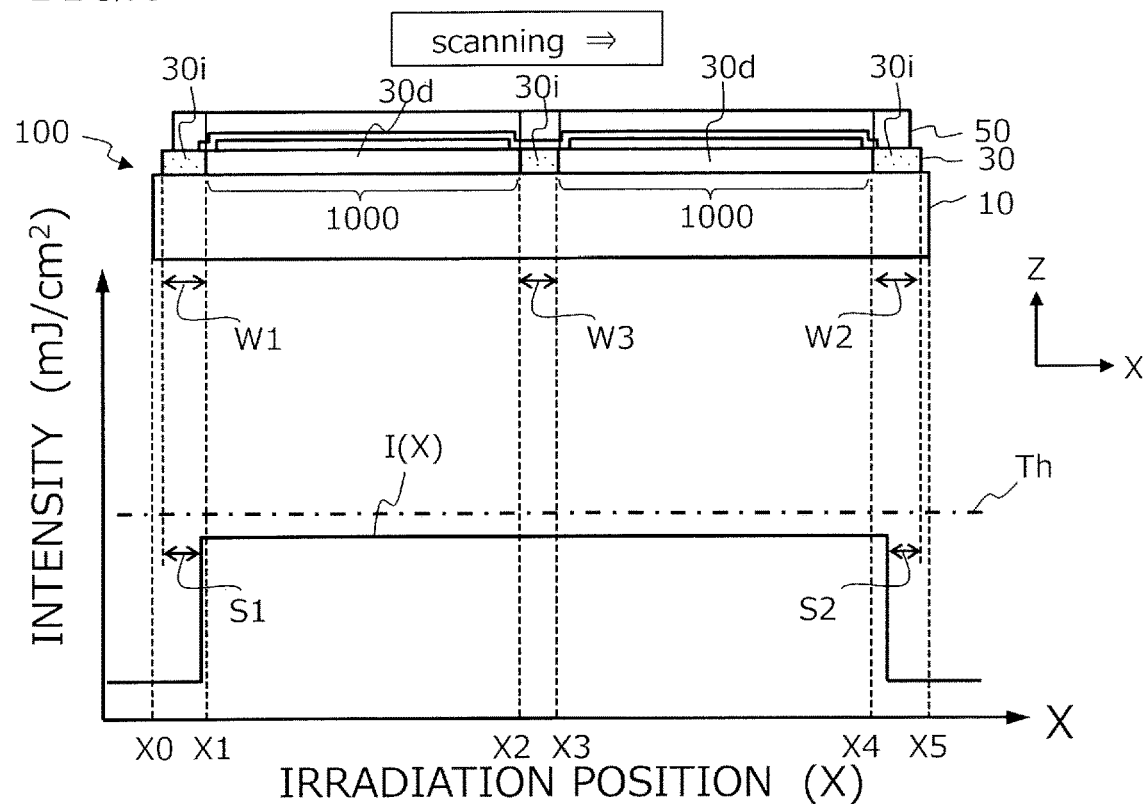
FIG. 8 is a diagram schematically showing an example of the distribution in the X-axis direction (scanning direction) of the irradiation intensity of the lift-off light in the first light scanning.

Next, see FIG. 8. FIG. 8 is a diagram schematically showing an example of the distribution in the X-axis direction (scanning direction) of the irradiation intensity of the lift-off light 216. In the graph of FIG. 8, the horizontal axis represents the X-axis coordinate of the irradiation position, and the vertical axis represents the irradiation intensity. In the graph of FIG. 8, a solid line represents the X-axis direction distribution I(X) of the irradiation intensity, and a dot-chain line represents threshold level Th of the irradiation intensity which is necessary for delamination.

In FIG. 8, a cross section of the multilayer stack 100 which is parallel to the XZ plane is shown above the graph for reference. This cross section is perpendicular to the cross section of FIG. 6. The glass base 10 extends from position X0 to position X5. The light-emitting device 1000 on the left-hand side in the drawing resides in the region extending from position X1 to position X2. The light-emitting device 1000 on the right-hand side resides in the region extending from position X3 to position X4. In other words, the flexible substrate regions 30$d$ of the plastic film correspond to the region extending from position X1 to position X2 and the region extending from position X3 to position X4. Meanwhile, the intermediate region 30$i$ of the plastic film 30 corresponds to the region extending from position X0 to position X1 (width: W1), the region extending from position X2 to position X3 (width: W3), and the region extending from position X4 to position X5 (width: W2). The intermediate region 30$i$ at the left edge of the plastic film in FIG. 8 (width: W1) includes a region in which the irradiation intensity is sufficiently lower than threshold level Th (width: S1). Meanwhile, the intermediate region 30$i$ at the right edge of the plastic film 30 in FIG. 8 (width: W2) includes another region in which the irradiation intensity is sufficiently lower than threshold level Th (width: S2). Here, W1>S1 and W2>S2 hold. It is preferred that width S1 is not less than 50% of width W1 and width S2 is not less than 50% of width W2.

The X-axis direction distribution I(X) of the irradiation intensity represents the whole (total or integral value) of a single scanning cycle with the lift-off light. For example, while the irradiation position of the lift-off light (the position of the center line of the line beam) moves from position X0 to position X5, the region extending from position X4 to position X5 is not irradiated with the lift-off light. In this period, the irradiation intensity of the lift-off light in the region extending from position X4 to position X5 is, as a matter of course, zero.

The line width (the short axis dimension, the size in the X-axis direction) of the lift-off light 216 can be, for example, about 0.2 mm (=200 μm). This dimension defines the largeness of the irradiation region at the interface between the plastic film 30 and the glass base 10 at a certain time. The lift-off light 216 can be emitted in the form of a pulsed or continuous wave. Irradiation with the pulsed wave can be carried out at the frequency (the number of shots in one second) of, for example, about 200 times per second. When the lift-off light 216 is a pulsed wave, the scanning speed is determined such that two consecutive shots form partially-overlapping irradiation regions. If, for example, the line width (the short axis dimension, the size in the X-axis direction) of the lift-off light 216 is 0.2 mm and the irradiation position moves at 20 mm per second in the X-axis direction, a gap can occur between neighboring shots so long as the number of shots per second is less than 100. Therefore, the number of shots per second needs to exceed 100.

The positioning accuracy of the irradiation position depends on the mechanical forwarding accuracy of the stage 210. When a YAG laser apparatus is used, the line width (the short axis dimension, the size in the X-axis direction) of the lift-off light 216 can be set to, for example, 40 μm. When the stage 210 is moved stepwise at intervals of 20 μm, the overlap of irradiation regions formed by two consecutive shots can be 50%. When the stage 210 is moved stepwise at intervals of 30 μm, the overlap of irradiation regions formed by two consecutive shots can be 75%. Although, in general, the line width (the short axis dimension, the size in the X-axis direction) of the lift-off light 216 depends on the type of the laser light source and the optical system, the irradiation intensity can be changed without modulating the power of the laser light source by controlling the overlap of irradiation regions.

When the irradiation position of the lift-off light is forwarded stepwise, "stepwise movement of the line beam source 214" and "pulsed irradiation with the lift-off light" can be repeated. In this case, irradiation with the lift-off light can be carried out while movement of the line beam source 214 relative to the stage 210 stopped. In irradiation of a stationary object with laser light, adjustment of the irradiation intensity to a target value is easier than in irradiation of a moving object with laser light. For example, the irradiation intensity can be adjusted by increasing or decreasing the number of irradiation pulses or the irradiation duration at a stationary position.

When the moving speed (scanning speed) of the irradiation position is fixed to a predetermined value, the irradiation intensity can be modulated by increasing or decreasing the number of shots per second. On the contrary, when the number of shots per second is fixed, the irradiation intensity can be modulated by increasing or decreasing the moving speed (scanning speed) of the irradiation position. The irradiation intensity can be modulated by changing the other parameters, e.g., the power of the line beam source 214 or the optical distance from the line beam source 214 to the multilayer stack 100. Also, a low irradiation region can be formed by providing a mechanical shutter between the line beam source 214 and the glass base 10 such that this shutter blocks the optical path of the lift-off light.

As seen from FIG. 8, in this example, the irradiation intensity of lift-off light for at least part of the interface between the intermediate region 30$i$ of the plastic film 30 and the glass base 10 is lower than the irradiation intensity of lift-off light for the interface between the flexible substrate regions 30*d* of the plastic film 30 and the glass base 10. The region of this "at least part" may be referred to as "low irradiation region". In the example of FIG. 8, the low irradiation region includes two parallel stripe regions extending along the peripheral edge of the glass base 10 (a region of width S1 and a region of width S2). The two stripe regions can be formed by irradiation with weak lift-off light 216 shown in FIG. 5A.

Figure 9:
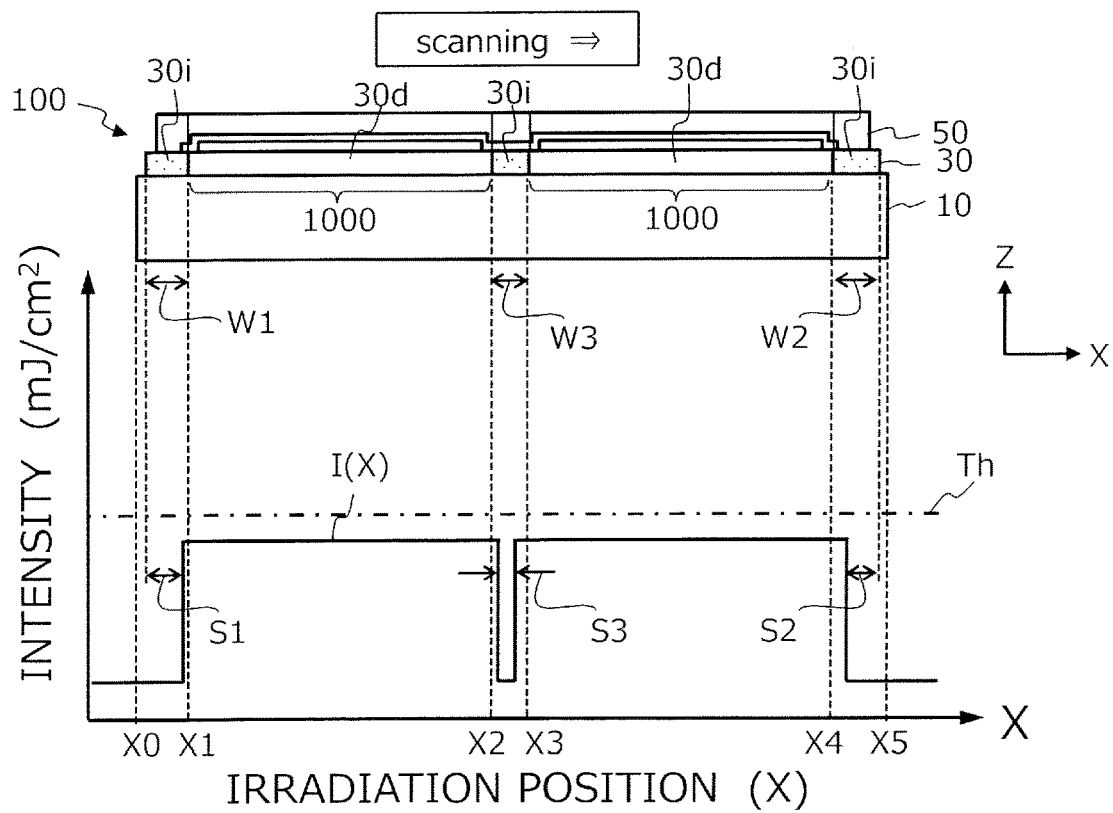
FIG. 9 is a diagram schematically showing another example of the distribution in the X-axis direction of the irradiation intensity of the lift-off light in the first light scanning.

FIG. 9 shows an example where the irradiation intensity is temporarily lower than threshold level Th in the middle of the scanning with the lift-off light 216. Specifically, the irradiation intensity is lower than threshold level Th in part of the region extending from position X2 to position X3 (width: S3). In this example, the "low irradiation region" at the interface between the intermediate region 30*i* of the plastic film 30 and the glass base 10 includes not only the two stripe regions but also a single middle stripe region (width: S3) which is parallel to the two stripe regions. Each of widths S1, S2, S3 of these stripe regions is, for example, not less than 1 mm and, in a certain example, not less than 3 mm.

In the examples of FIG. 8 and FIG. 9, two light-emitting devices 1000 are arranged in the direction of the X-axis. When N is an integer not less than 3 and N light-emitting devices 1000 are arranged in the direction of the X-axis, the total number of stripes formed by the intermediate region 30*i* lying between two adjoining light-emitting devices 1000 is N−1. It is not necessary to provide a low irradiation region in all of the N−1 stripes. Alternatively, a plurality of low irradiation regions may be provided for an intermediate region 30*i* which forms a single stripe.

Figure 10A:
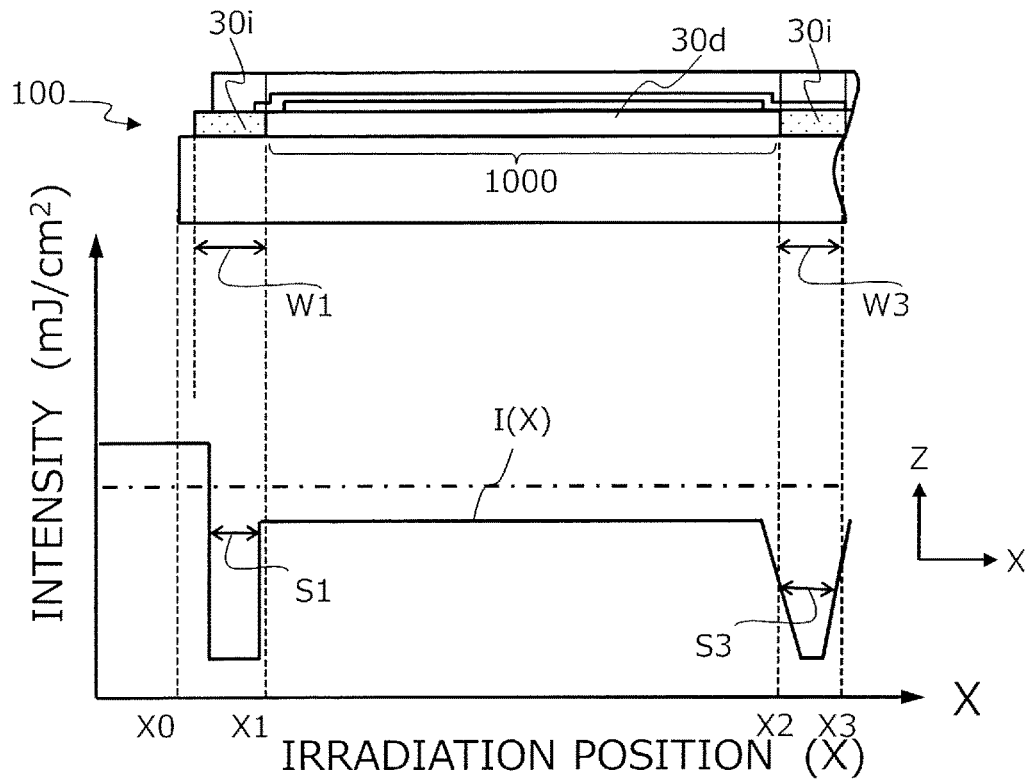
FIG. 10A is a diagram schematically showing still another example of the distribution in the X-axis direction of the irradiation intensity of the lift-off light.
Figure 10B:
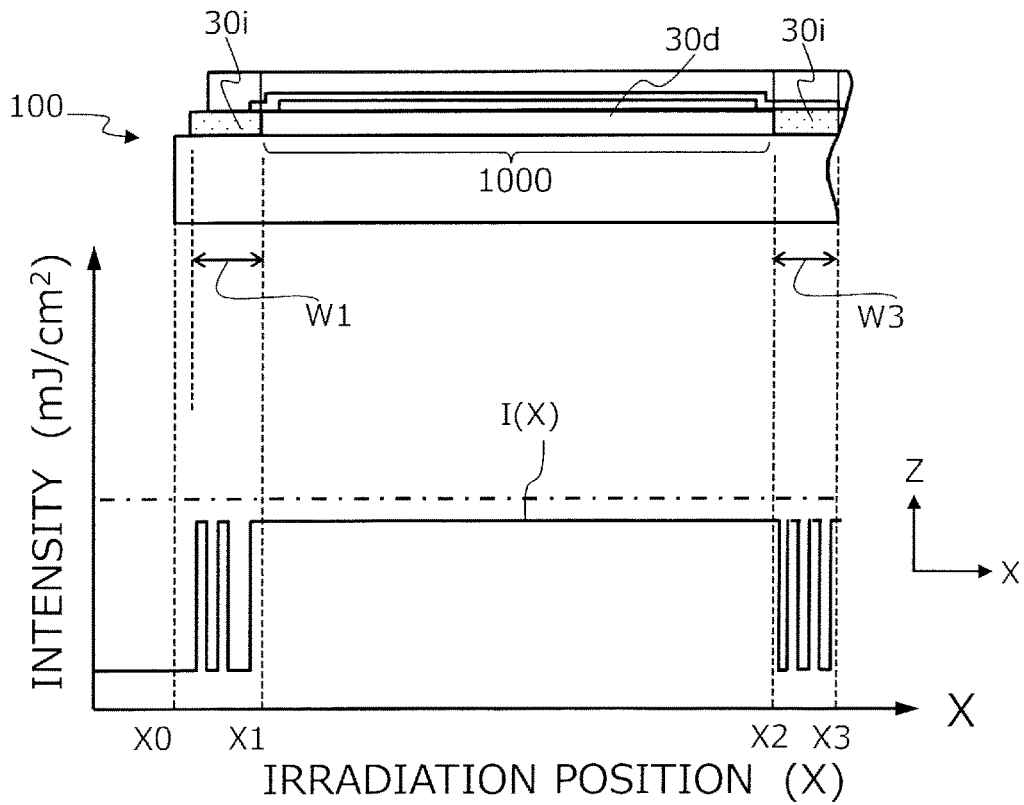
FIG. 10B is a diagram schematically showing still another example of the distribution in the X-axis direction of the irradiation intensity of the lift-off light.

In the examples of FIG. 8 and FIG. 9, the low irradiation region of width S1 and the low irradiation region of width S2 each reach the peripheral edge of the plastic film 30, although the embodiment of the present disclosure is not limited to this example. For example, the low irradiation region can be in various forms as shown in FIG. 10A and FIG. 10B. FIG. 10A and FIG. 10B are diagrams schematically showing still other examples of the distribution in the X-axis direction of the irradiation intensity of the lift-off light. In these drawings, examples of the modulation pattern of the irradiation intensity at the interface between the intermediate region 30*i* surrounding the light-emitting device 1000 on the left-hand side of FIG. 8 and the glass base 10 are shown.

In the example shown in FIG. 10A, the striped low irradiation regions (width: S1) extending along the peripheral edge of the plastic film 30 do not reach the peripheral edge of the plastic film 30. The irradiation intensity of the lift-off light may exceed threshold level Th before the glass base 10 is irradiated with the lift-off light. As in the region extending from position X1 to position X3 shown in FIG. 10A, the irradiation intensity may gradually change. When the irradiation intensity gradually changes, the width (the size in the scanning direction) of the "low irradiation region" can be defined as the width of a region in which the irradiation intensity in a single light scanning cycle is lower than threshold level Th.

In the example shown in FIG. 10B, the low irradiation region consists of a plurality of stripes which have a relatively narrow width. When the lift-off light is, for example, pulsed light, such a low irradiation region can be realized by applying consecutive shots such that irradiation regions do not overlap each other.

Next, the second light scanning is described with reference to FIG. 11 to FIG. 14. The second light scanning is carried out in a direction different from the direction of the first light scanning.

Figure 7:
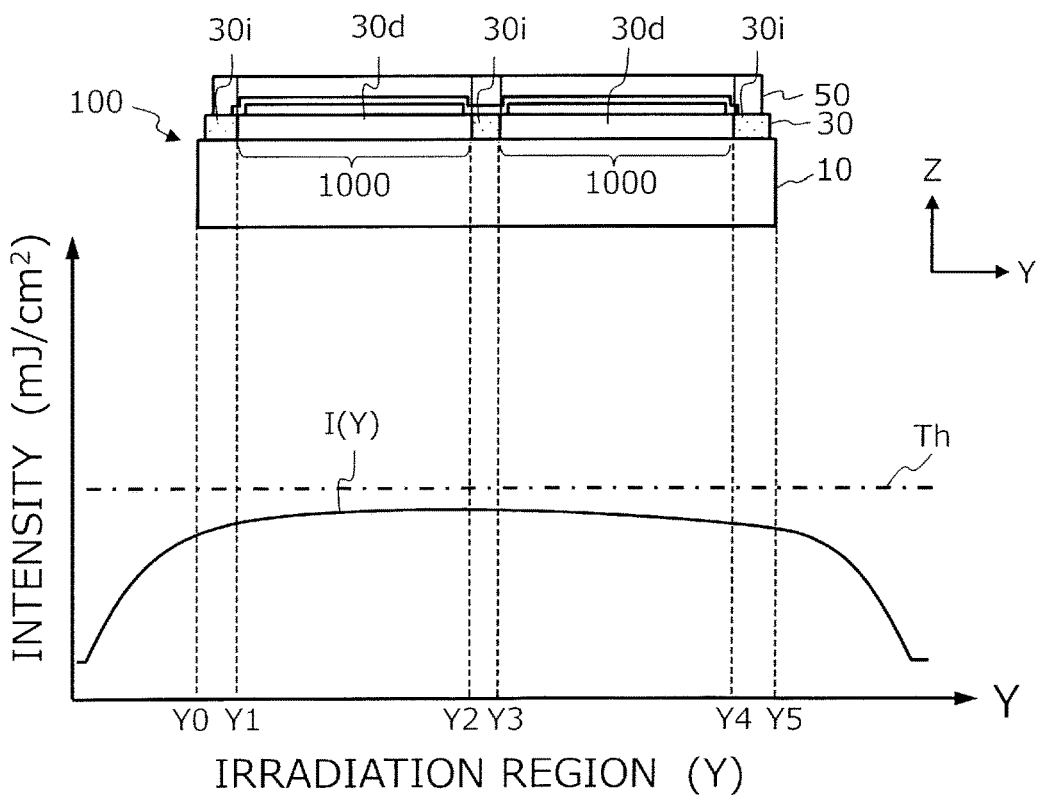
FIG. 7 is a diagram schematically showing another example of the distribution in the Y-axis direction of the irradiation intensity of the lift-off light in the first light scanning.
Figure 11:
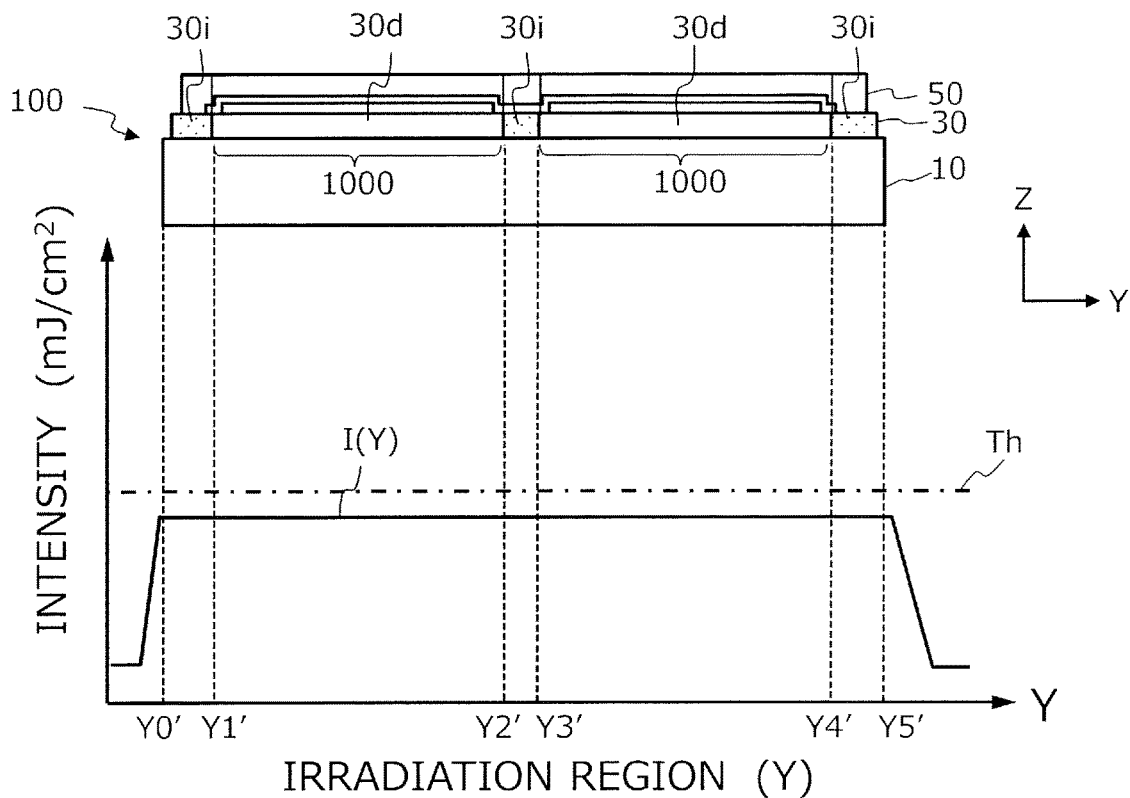
FIG. 11 is a diagram schematically showing an example of the distribution in the Y-axis direction of the irradiation intensity of the lift-off light in the second light scanning.
Figure 12:
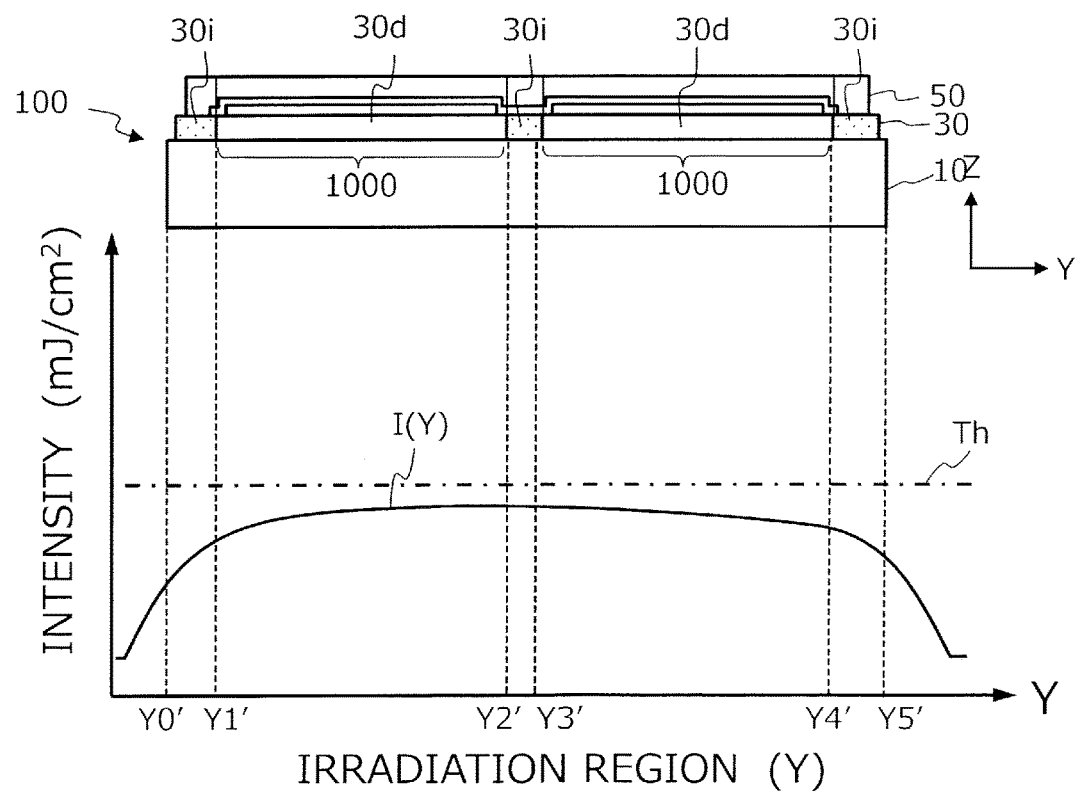
FIG. 12 is a diagram schematically showing another example of the distribution in the Y-axis direction of the irradiation intensity of the lift-off light in the second light scanning.

FIG. 11 and FIG. 12 correspond to FIG. 6 and FIG. 7. A difference in the drawings resides in the difference in the cross section of the multilayer stack 100. To meet the cross section of the multilayer stack 100, position Y0 to position Y5 of FIG. 6 and FIG. 7 are shifted to position Y0' to position Y5', respectively.

Figure 13:
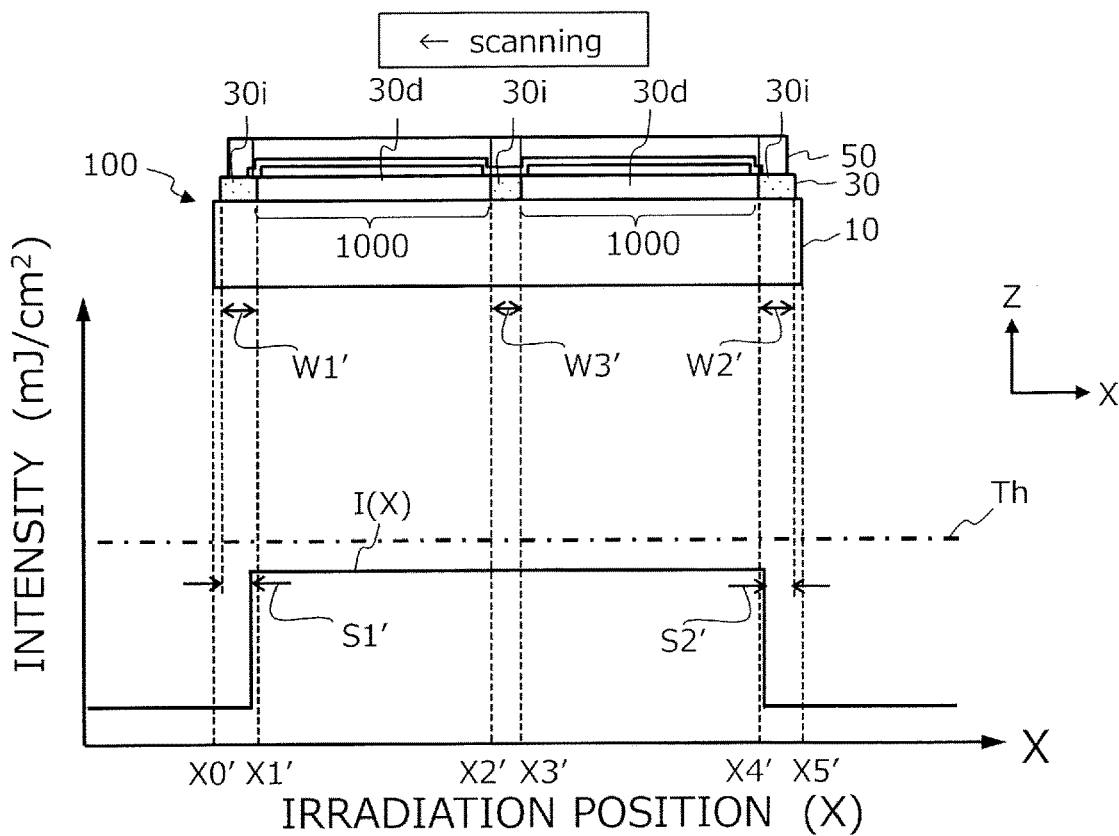
FIG. 13 is a diagram schematically showing an example of the distribution in the X-axis direction (scanning direction) of the irradiation intensity of the lift-off light in the second light scanning.
Figure 14:
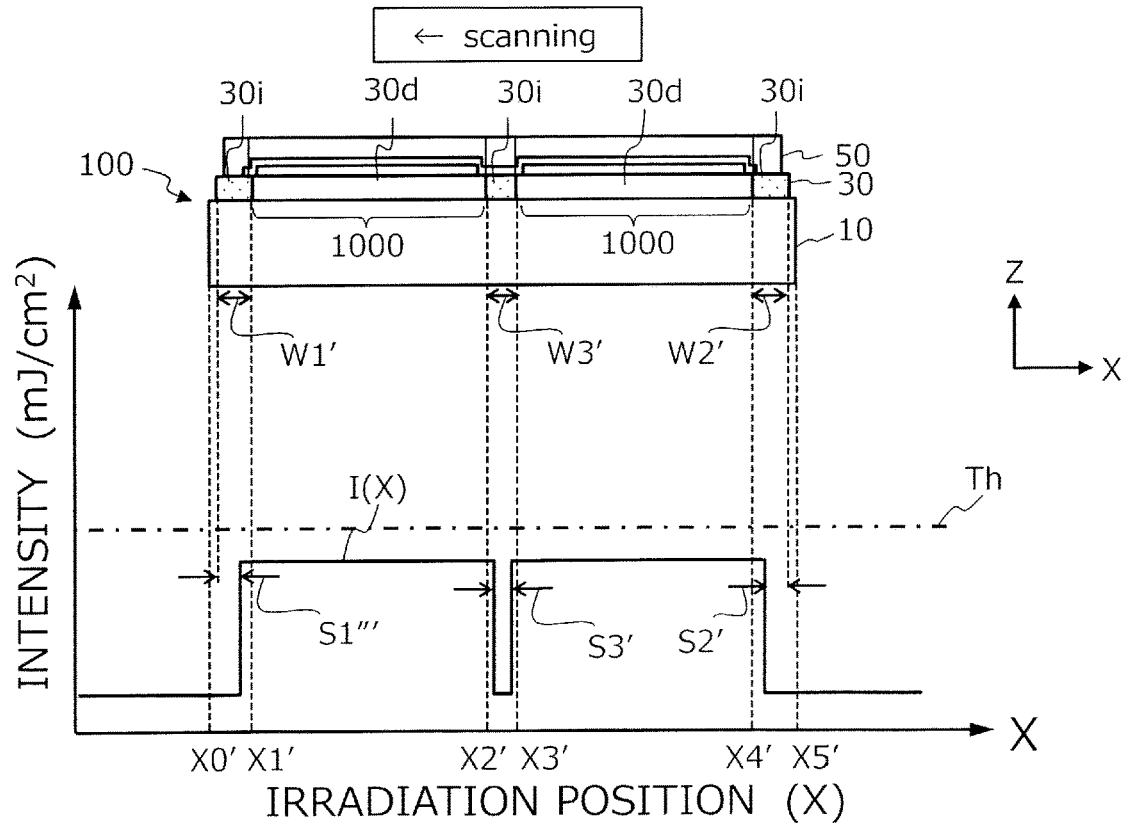
FIG. 14 is a diagram schematically showing another example of the distribution in the X-axis direction of the irradiation intensity of the lift-off light in the second light scanning.

FIG. 13 and FIG. 14 correspond to FIG. 8 and FIG. 9 and show the irradiation intensity in the second light scanning. The first difference in the drawings resides in the difference in the cross section of the multilayer stack 100. To meet the cross section of the multilayer stack 100, position X0 to position X5 of FIG. 8 and FIG. 9 are shifted to position X0' to position X5', respectively. Widths W1, W2, W3 are represented by widths W1', W2', W3'. The waveform of the X-axis direction distribution I(X) of the irradiation intensity of the lift-off light in the second light scanning does not need to be identical with the X-axis direction distribution I(X) of the irradiation intensity of the lift-off light in the second light scanning. The highest value and/or the lowest value of the irradiation intensity also do not need to be identical between the first and second light scanning.

Figure 15A:
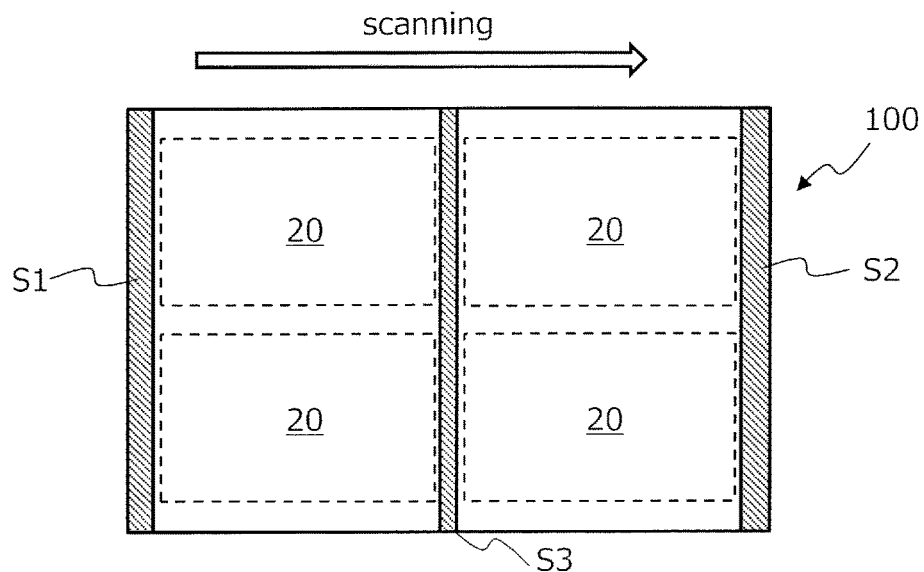
FIG. 15A is a plan view schematically showing low irradiation regions by the first light scanning.

FIG. 15A is a plan view showing the outline of the first light scanning and an example of the shape and arrangement of low irradiation regions S1, S2, S3 to be formed. The low irradiation regions S1, S2, S3 are formed at positions not overlapping the functional layer regions 20. Also in the other regions than the low irradiation regions S1, S2, S3, the irradiation intensity of the lift-off light in the first light scanning does not reach threshold level Th.

Figure 15B:
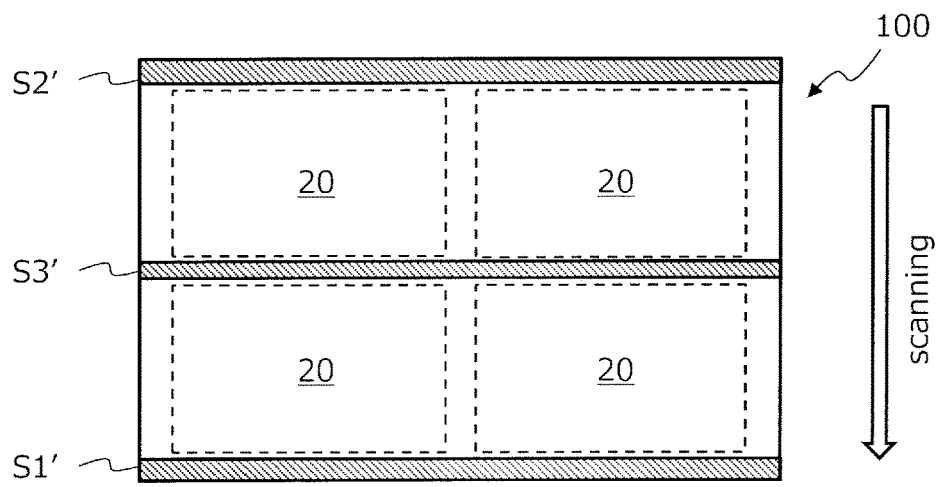
FIG. 15B is a plan view schematically showing low irradiation regions by the second light scanning.

FIG. 15B is a plan view showing the outline of the second light scanning and an example of the shape and arrangement of low irradiation regions S1', S2', S3' to be formed. The low irradiation regions S1', S2', S3' are also formed at positions not overlapping the functional layer regions 20. In the other regions than the low irradiation regions S1', S2', S3', the irradiation intensity of the lift-off light in the second light scanning does not reach threshold level Th, but the accumulated value of the irradiation intensity of the lift-off light in the first and second light scanning exceeds threshold level Th.

Figure 15C:
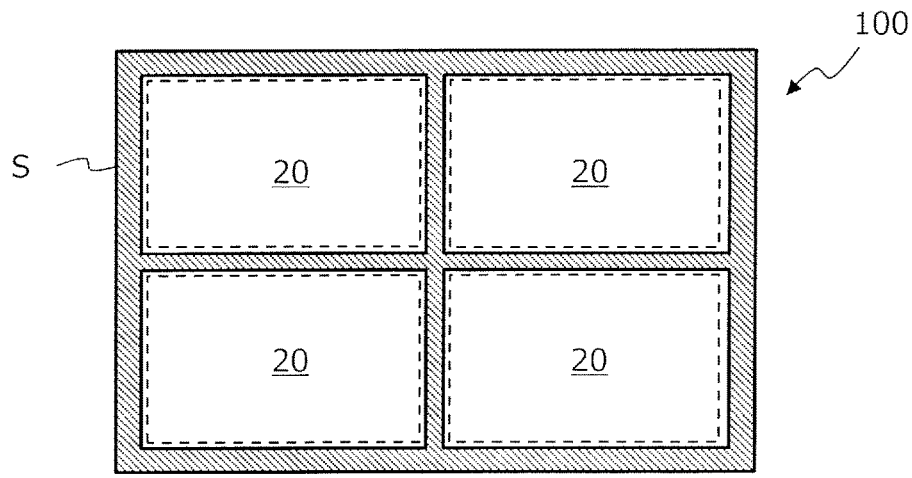
FIG. 15C is a plan view schematically showing the entire shape of a low irradiation region after the first and second light scanning.

FIG. 15C is a plan view showing an example of the entire shape of a low irradiation region S after the two light scanning cycles. In the example illustrated in FIG. 15C, the four rectangular regions represent regions in which the total irradiation intensity of the lift-off light sufficiently exceeds threshold level Th through the two light scanning cycles. In the hatched region S, the total irradiation intensity of the lift-off light is lower than threshold level Th even through the two light scanning cycles. In a region which is a low irradiation region at least once in the two light scanning cycles, the irradiation intensity of the lift-off light is determined such that the irradiation intensity does not finally reach threshold level Th.

According to the present embodiment, light scanning which is carried out while modulating the irradiation intensity is performed twice in different directions (directions transverse to each other, typically directions perpendicular to each other), whereby a low irradiation region S of a shape such as shown in FIG. 15C can be formed. Therefore, the intermediate region 30*i* of the plastic film 30 can be selectively kept bound to the glass base 10.

In the present embodiment, the moving direction of the stage 210 in the second light scanning is opposite to the moving direction of the stage 210 in the first light scanning, although these moving directions may be identical.

<Lift-Off Light Irradiation Unit 2>

The lift-off light irradiation unit according to the present disclosure does not necessary to comprise the above-described light sources. The lift-off light may be radiated from an incoherent light source instead of a coherent light source such as laser light source. In the example described in the following paragraphs, the interface between the plastic film and the glass base is irradiated with lift-off light radiated from a plurality of light emitting diode devices.

As the light source for radiating the lift-off light, light emitting diode devices are available at a lower cost than coherent light sources such as semiconductor laser devices, and designing and operation of the apparatus are easier from the viewpoint of eye-safety. Light emitting diode (UV-LED) devices which are capable of radiating ultraviolet light have the size of, for example, 3.5 mm (longitudinal)×3.5 mm (transverse)×1.2 mm (thickness). The technique of enlarging and shaping a spot beam laser light into a line beam laser (lift-off light) by an optical system is difficult to apply to a substrate having a G8 size (2400 mm×2200 mm) or more. The reason for this is that the optical system becomes huge, so that the manufacturing cost is too high and the quality (uniformity) of the line beam is deteriorated. When using line-beam-shaped laser light, the limit was practically up to the G6H substrate size (1800 mm×750 mm short side). Unlike such a conventional laser lift-off equipment, a lift-off light source in which a plurality of light emitting diode are arrayed makes it possible to process a G8 substrate or a super-large substrate larger.

The emission intensity of the light emitting diode device is controlled by adjusting the magnitude of the driving current. Therefore, a plurality of light emitting diode devices, by modulating the driving current flowing through each of the light emitting diode devices, the irradiation intensity of the lift-off light can be modulated.

The array pitch of the light emitting diode devices is in the range of, for example, not less than 3 mm and not more than 10 mm. The light radiated from the light emitting diode devices is incoherent (non-coherent) light, which is different from laser light. The wavelength of the light radiated from the light emitting diode devices is in the range of, for example, not less than 300 nm and not more than 380 nm. The irradiation energy of the lift-off light radiated from the plurality of light emitting diode devices is in the range of not less than 100 mJ/cm$^2$ and not more than 300 mJ/cm$^2$.

Light radiated from each of the light emitting diode devices diverges around the Z-axis direction at the center. This light represents the distribution (directivity) of the relative radiation intensity which depends on the radiation angle θ that is the gradient from the Z-axis. In one example, the relative radiation intensity of the light emitting diode devices can be about 75% at θ=45°, and about 50% at θ=65°. The directivity of the light emitting diode devices can be adjusted by providing a lens and/or reflector.

Commercially-available light emitting diode devices are capable of radiating ultraviolet light at 365 nm with the power of 1450 milliwatts on the driving conditions that, for example, the electric voltage is 3.85 volts and the electric current is 1000 milliamperes.

An example of a line beam light source in which a plurality of light emitting diode devices are arrayed is described with reference to FIG. 27A, FIG. 27B and FIG. 27C.

Figure 27A:
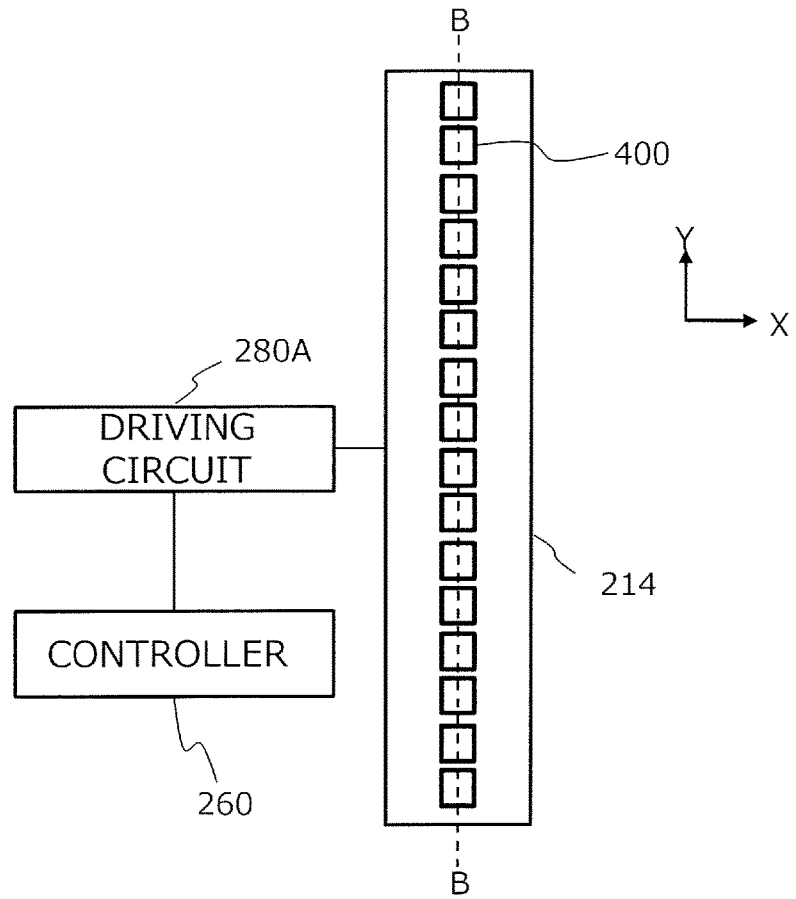
FIG. 27A is a diagram schematically showing the upper surface of a line beam source 214 which includes a single column of light emitting diode devices arrayed in Y-axis direction.
Figure 27B:
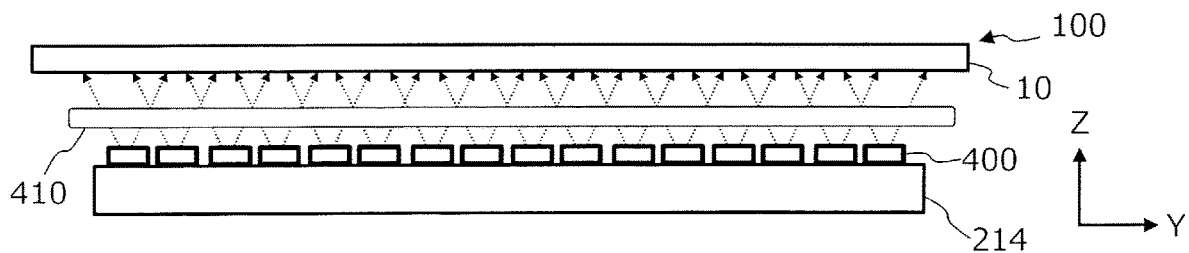
FIG. 27B is a cross-sectional view of the line beam source shown in FIG. 27A taken along line B-B.

FIG. 27A schematically shows the upper surface of a line beam light source 214 which includes a plurality of light emitting diode devices 400 arrayed in Y-axis direction. FIG. 27B is a cross-sectional view of the line beam light source 214 shown in FIG. 27A taken along line B-B. FIG. 27B also shows a multilayer stack 100. FIG. 27C is a diagram showing the moving direction of the line beam light source 214 relative to the multilayer stack 100.

As shown in FIG. 27A, the line beam light source 214 can be coupled with a driving circuit 280A. The driving circuit 280A can modulate the magnitude of the electric current flowing through each of the light emitting diode devices 400. The driving circuit 280A can be coupled with a controller 260. The controller 260 controls the operation of the driving circuit 280A, thereby temporally and/or spatially modulating the irradiation intensity of the lift-off light radiated from the line beam light source 214.

In this example, the ultraviolet light radiated from the light emitting diode devices 400 travels through a cylindrical lens 410 and enters the glass base 10 of the multilayer stack 100 in order to increase the irradiation energy per unit area (irradiation intensity expressed in joule/cm$^2$). Since the ultraviolet light is focused in X-axis direction, the width (the size in X-axis direction) of the irradiation region in the interface at which delamination is to occur (delamination plane) can be decreased to, for example, about 0.2 mm or smaller. Since the cylindrical lens 410 does not focus the light in X-axis direction, the size in Y-axis direction of the irradiation region is not shortened.

The irradiation intensity of the lift-off light can be increased by decreasing the array pitch of the light emitting diode devices 400 such that the number density of the light emitting diode devices 400 increases. For example, when each of the light emitting diode devices 400 has the above-described size, several tens of light emitting diode devices 400 or 100 or more light emitting diode devices 400 may be arrayed with the intervals of 3.5 mm to 10 mm (array pitch: the distance between the centers of adjoining light sources). When smaller light emitting diode devices 400 are used, they can be arrayed with the intervals of, for example, 2.0 mm to 10 mm. The array pitch of the light emitting diode devices 400 is preferably not more than 5 mm.

When light emitting diode devices 400 of high directivity are arrayed at a high density and the distance from the light emitting diode devices 400 to the delamination plane is, for example, 1.5-5 mm, the irradiation intensity can be modulated at the spatial resolution of 2 mm to 10 mm even without an optical element such as cylindrical lens.

Figure 27C:
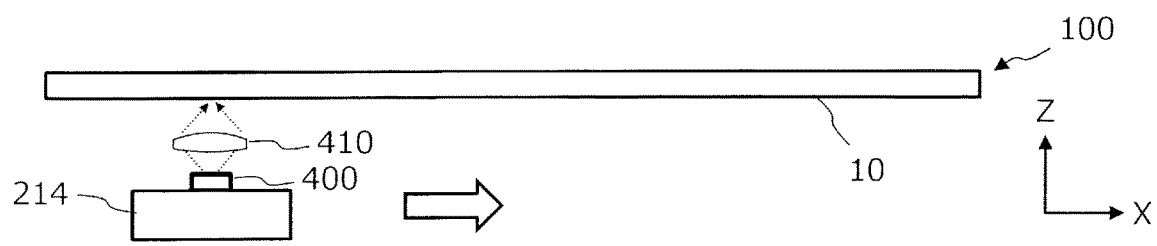
FIG. 27C is a diagram showing the moving direction of the line beam source relative to the multilayer stack 100.

The electric current flowing through each of the light emitting diode devices is modulated while the line beam light source 214 is moved relative to the multilayer stack 100 as shown in FIG. 27C. As a result, lift-off light irradiation can be realized in the same way as the embodiment with the use of the line beam light source 214.

To increase the spatial resolution of the line beam light source 214, the light emitting diode devices 400 may be arrayed in a plurality of columns.

Figure 28A:
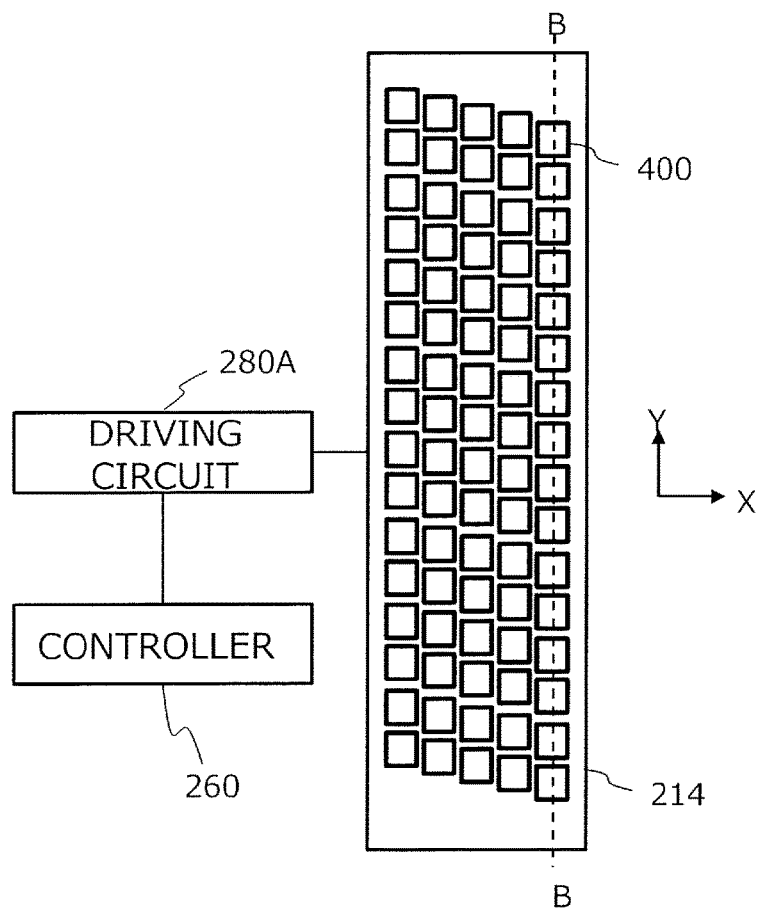
FIG. 28A is a diagram schematically showing the upper surface of a line beam source 214 which includes a plurality of columns of light emitting diode devices arrayed an Y-axis direction.
Figure 28B:
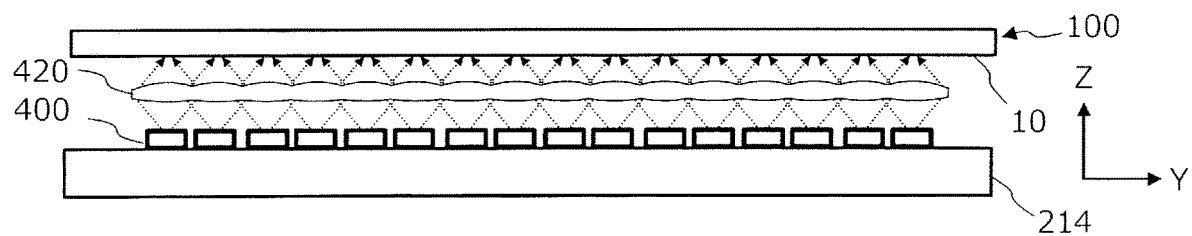
FIG. 28B is a cross-sectional view of the line beam source shown in FIG. 28A taken along line B-B.
Figure 28C:
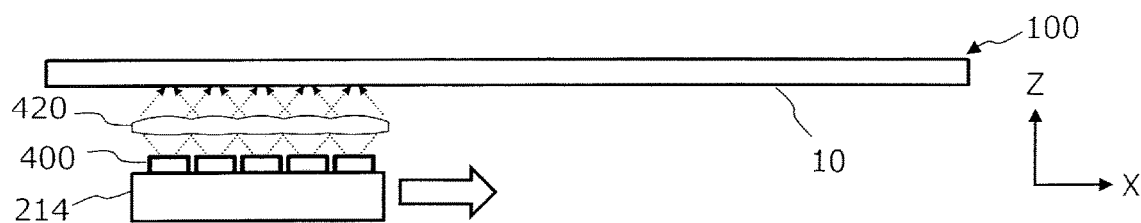
FIG. 28C is a diagram showing the moving direction of the line beam source relative to the multilayer stack.

FIG. 28A schematically shows the upper surface of the line beam light source 214 which includes a plurality of columns of light emitting diode devices 400 arrayed in Y-axis direction. FIG. 28B is a cross-sectional view of the line beam light source 214 shown in FIG. 28A taken along line B-B. FIG. 28B also shows the multilayer stack 100. FIG. 28C is a diagram showing the moving direction of the line beam light source 214 relative to the multilayer stack 100.

This line beam light source 214 can also be coupled with the driving circuit 280A. The controller 260 controls the operation of the driving circuit 280A, thereby modulating the lift-off light radiated from the line beam light source 214.

In this example, the line beam light source 214 includes five columns of light emitting diode devices 400 each extending in Y-axis direction. The positions in Y-axis direction of the five columns of light emitting diode devices 400 are different from one another. The positions of the light emitting diode columns are shifted by P/5 in Y-axis direction between adjoining columns where P is the array pitch.

This line beam light source 214 includes a lens sheet 420 for converging light such that one side of the irradiation region formed by each of the light emitting diode devices 400 has the length of about P/5. Ultraviolet light transmitted through the lens sheet 420 can form irradiation regions in the form of dots over the delamination plane.

As shown in FIG. 28C, when the line beam light source 214 is moved relative to the multilayer stack 100, a plurality of irradiation regions overlap so that the entire delamination plane can be irradiated with the ultraviolet light. By modulating the electric current flowing through each of the light emitting diode while the line beam light source 214 is moved relative to the multilayer stack 100, spatial and temporal modulation can be carried out.

Figure 28D:
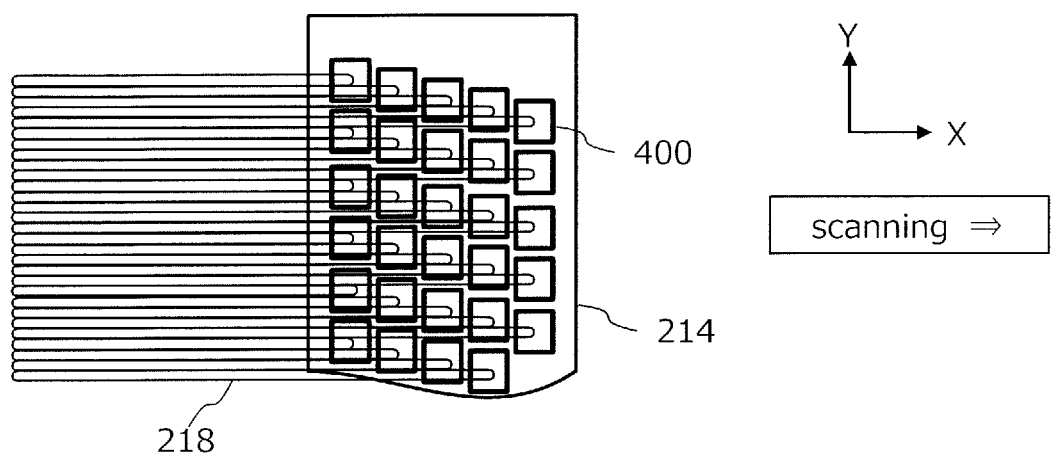
FIG. 28D is a plan view schematically showing irradiation regions the line beam source of FIG. 28A is forming.

FIG. 28D is a diagram schematically showing irradiation regions 218 the line beam source 214 of FIG. 28A is forming. By turning off some of the light emitting diode devices 400 during scanning by the line beam light source 214, non-irradiation regions whose width is smaller than the size of the light emitting diode devices 400 can be formed.

Figure 28E:
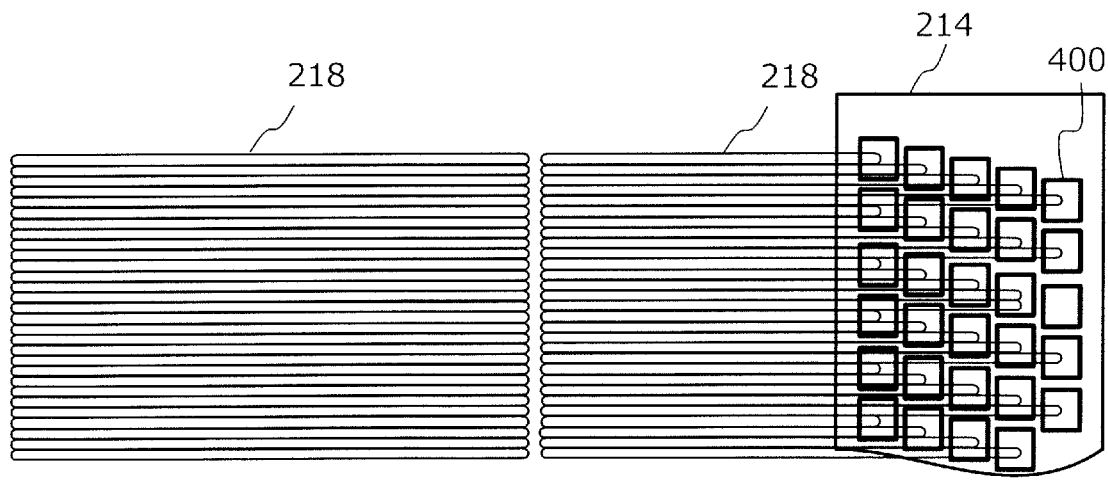
FIG. 28E is a plan view showing an example of irradiation regions formed by temporarily modulating the electric current flowing through each of the light emitting diode devices during scanning by the line beam source.

FIG. 28E is a plan view showing an example of irradiation regions formed by temporarily modulating the electric current flowing through each of the light emitting diode devices 400 during scanning by the line beam source 214. It is seen that a pattern of irradiation regions and non-irradiation regions can be formed with high spatial resolution.

Thus, according to the array of the light emitting diode devices 400 illustrated in FIG. 28A, modulation with high spatial resolution is possible as compared with the array of the light emitting diode devices 400 illustrated in FIG. 27A.

As such a light source is used for performing the first light scanning and the second light scanning, the above-described irradiation intensity distribution for delamination can be achieved at a lower cost than the expensive laser light source. Furthermore, since laser light is not used, it is also advantageous from the viewpoint of safety for human eyes (eye-safe).

<Lift-Off>

Figure 16A:
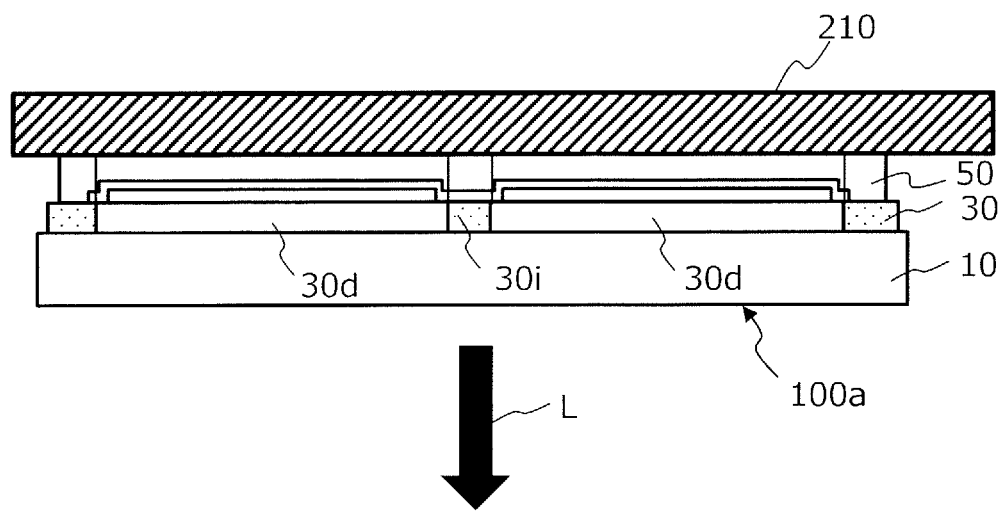
FIG. 16A is a cross-sectional view schematically showing the multilayer stack before the multilayer stack is separated into the first portion and the second portion after irradiation with lift-off light.

FIG. 16A illustrates a state where the multilayer stack 100 is in contact with the stage 210 after irradiation with the lift-off light. While this state is maintained, the distance from the stage 210 to the glass base 10 is increased. At this point in time, the stage 210 of the present embodiment holds a light-emitting device portion of the multilayer stack 100.

An unshown actuator holds the glass base 10 and moves the entirety of the glass base 10 in the direction of arrow L, thereby carrying out delaminating (lift-off). The glass base 10 can be moved together with an unshown chuck stage while being adhered by suction to the chuck stage. The direction of movement of the glass base 10 does not need to be vertical, but may be diagonal, to the first surface 100a of the multilayer stack 100. The movement of the glass base does not need to be linear but may be rotational. Alternatively, the stage 210 may be moved upward in the drawing while the glass base 10 is secured by an unshown holder or another stage.

Figure 16B:
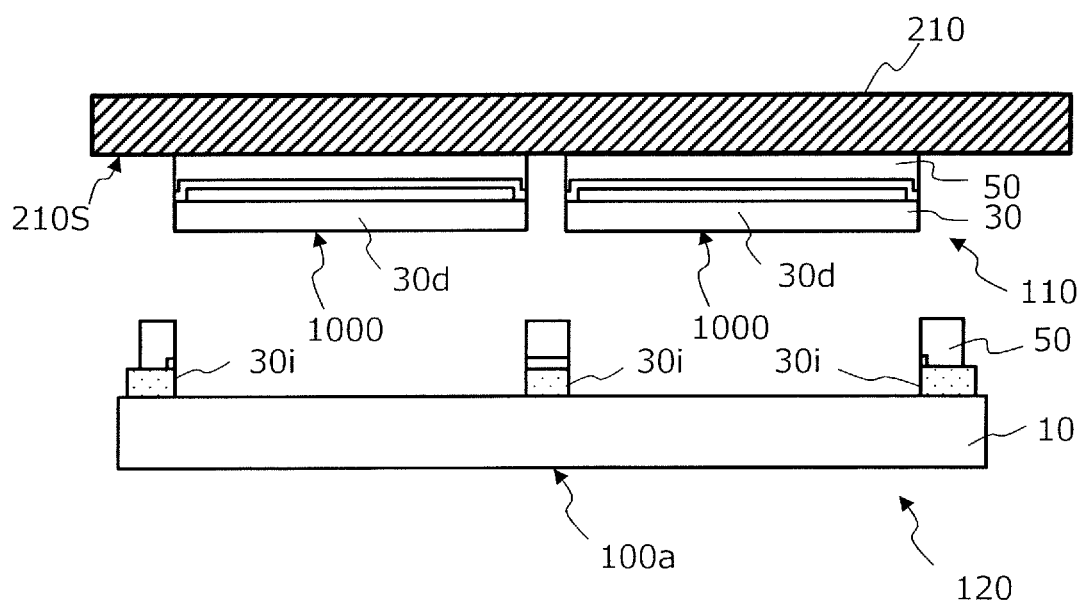
FIG. 16B is a cross-sectional view schematically showing the multilayer stack separated into the first portion and the second portion.
Figure 17:
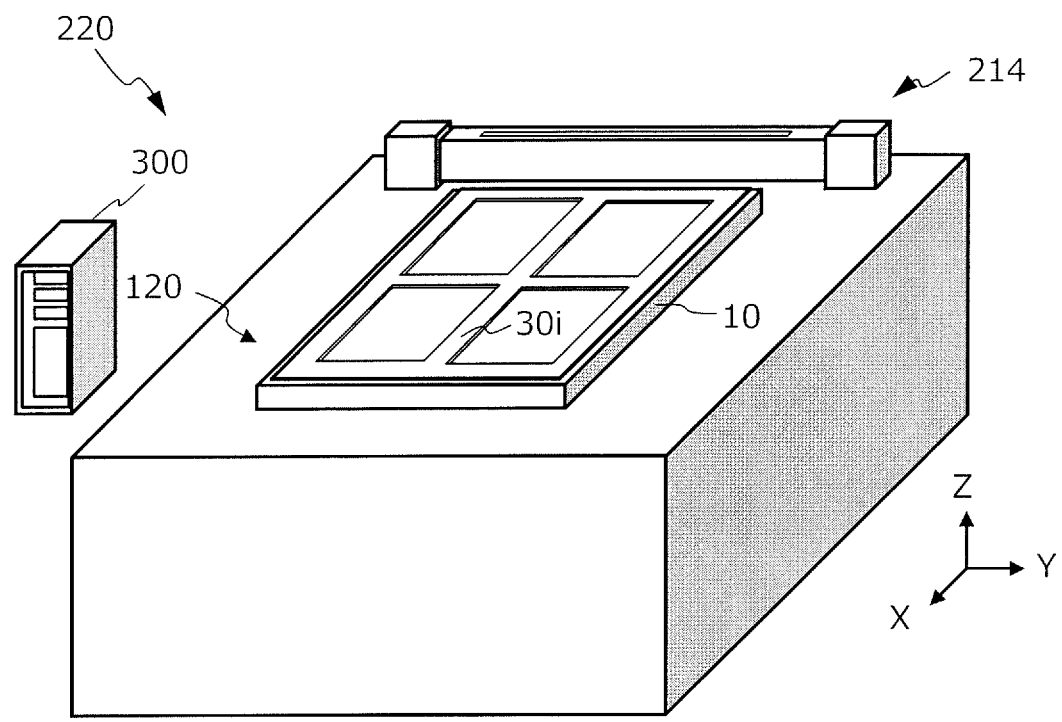
FIG. 17 is a perspective view showing the glass base separated from the multilayer stack by a delaminating apparatus.

FIG. 16B is a cross-sectional view showing the thus-separated first portion 110 and second portion 120 of the multilayer stack 100. FIG. 17 is a perspective view showing the second portion 120 of the multilayer stack 100. The first portion 110 of the multilayer stack 100 includes a plurality of light-emitting devices 1000 which are in contact with the stage 210. The respective light-emitting devices 1000 include the functional layer regions 20 and the plurality of flexible substrate regions 30d of the plastic film 30. Meanwhile, the second portion 120 of the multilayer stack 100 includes the glass base 10 and the intermediate region 30i of the plastic film 30. The intermediate region 30i of the plastic film 30 is bound to the glass base 10 in at least some low-irradiation regions. Thus, the entirety of the intermediate region 30i of the plastic film 30 separates from the stage 210 while the entirety of the intermediate region 30i is kept adhered to the glass base 10.

In the example of FIG. 17, both the irradiation process with the lift-off light and the delaminating process are carried out using the delaminating apparatus 220 that includes the stage 210. The embodiment of the present disclosure is not limited to this example. The irradiation process with the lift-off light may be carried out using a lift-off light irradiation unit (delaminating apparatus) which includes the stage 210, while the delaminating process is carried out using a different apparatus that includes another stage which is different from the stage 210. In this case, after irradiation with the lift-off light, it is necessary to transfer the multilayer stack 100 from the stage 210 to another unshown stage. When the same stage is used for carrying out both the irradiation process with the lift-off light and the delaminating process, the step of transferring the multilayer stack between the stages can be omitted.

As described above, in the present embodiment, the step of separating the multilayer stack 100 into the first portion 110 and the second portion 120 is carried out while the stage 210 holds the second surface 100b of the multilayer stack 100 by suction. The essence of this separation step resides in that an unnecessary part of the multilayer stack 100 which is not a constituent of the light-emitting device 1000 separates together with the glass base 10 from the stage 210. In the present embodiment, the cutting step illustrated in FIG. 2, i.e., the step of cutting a part of the multilayer stack 100 exclusive of the glass base 10 into the plurality of light-emitting devices 1000 and the remaining unnecessary portions, is carried out before irradiation with the lift-off light. Carrying out the cutting step before the lift-off light irradiation step is effective in realizing the separation illustrated in FIG. 16B and FIG. 17. In order that an unnecessary portion which is not a constituent of the light-emitting device 1000 remains on the glass base 10, the irradiation intensity of the lift-off light is modulated such that part of that unnecessary portion is kept bound to the glass base 10.

<Steps After Delaminating>

Figure 18:
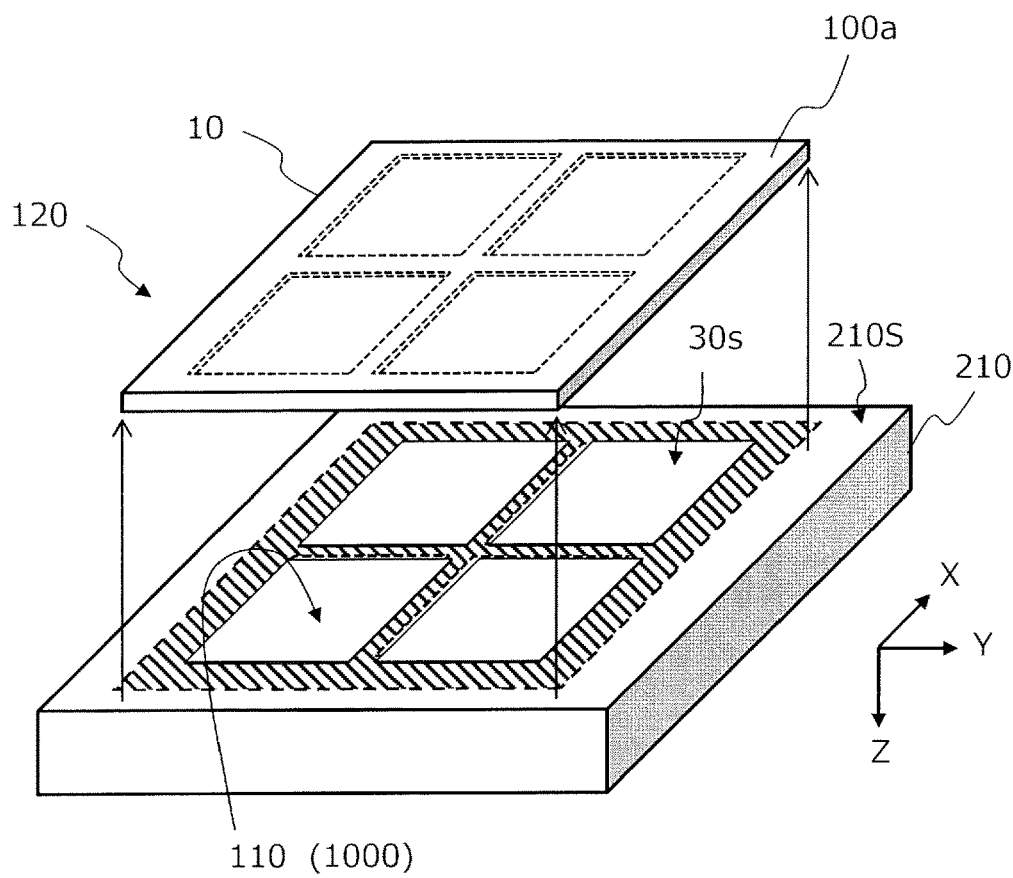
FIG. 18 is a perspective view showing removal of the glass base from the stage.

FIG. 18 is a perspective view showing the first portion 110 (light-emitting devices 1000) of the multilayer stack 100 adhered by suction to the stage 210 and the second portion 120 (the glass base 10 and objects bound thereto) at a position distant from the stage 210. Unnecessary portions of the multilayer stack 100 which are not constituents of the light-emitting devices 1000 are bound to the glass base 10.

Figure 19:
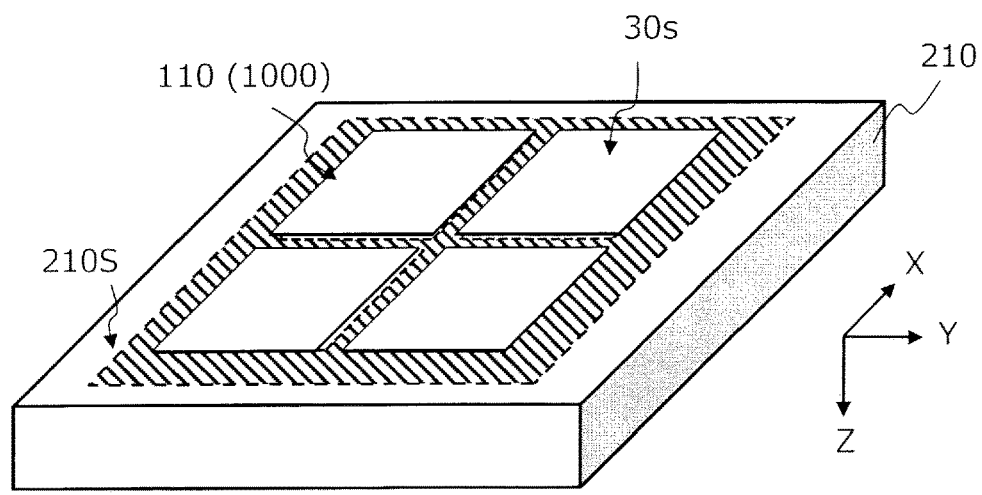
FIG. 19 is a perspective view showing the stage from which the glass base has been removed.

FIG. 19 is a perspective view showing the first portion 110 of the multilayer stack 100 adhered by suction to the stage 210. The first portion 110 of the multilayer stack 100 supported by the stage 210 includes a plurality of light-emitting devices 1000 arrayed in rows and columns. In the example of FIG. 19, a part of the plastic film 30, specifically the surface (delaminated surface) 30s of the flexible substrate regions 30d, is exposed.

Figure 20:
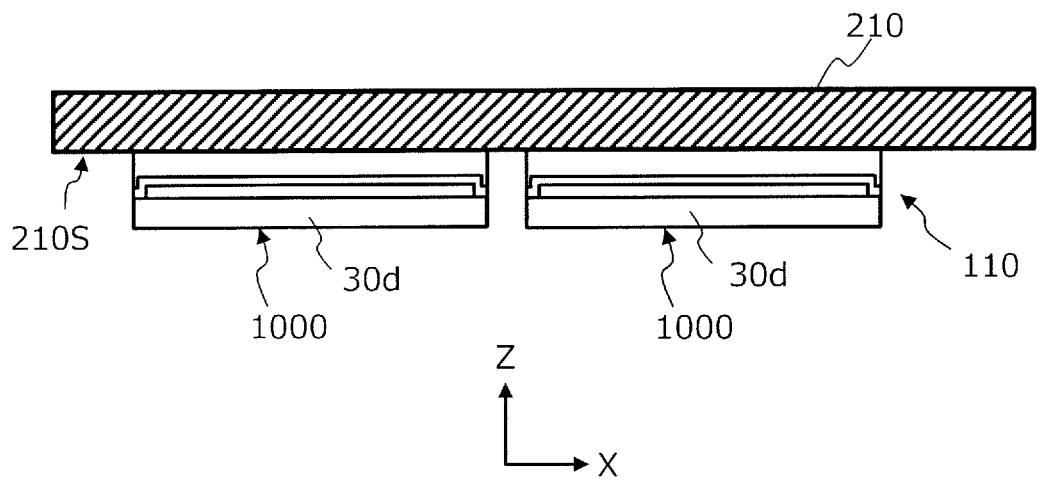
FIG. 20 is a cross-sectional view showing the stage from which the glass base has been removed.

FIG. 20 is a cross-sectional view showing that the stage 210 holds the light-emitting devices 1000 by suction. This cross section is parallel to the ZX plane. The direction of the Z-axis of FIG. 20 is opposite to the direction of the Z-axis of FIG. 18 and FIG. 19.

Various processes can be sequentially or concurrently performed on the plurality of light-emitting devices 1000 which are in contact with the stage 210.

The "processes" to be performed on the light-emitting devices 1000 can include attaching a dielectric and/or electrically-conductive film to each of the plurality of light-emitting devices 1000, cleaning or etching each of the plurality of light-emitting devices 1000, and mounting an optical part and/or an electronic part to each of the plurality of light-emitting devices 1000. Specifically, a part such as, for example, a polarizer, encapsulation film, touchscreen, heat radiation sheet, electromagnetic shield, driver integrated circuit, or the like, can be mounted to the flexible substrate region 30d of each of the light-emitting devices 1000. The sheet-like part includes a functional film which can add an optical, electrical or magnetic function to the light-emitting devices 1000.

The plurality of light-emitting devices 1000 are supported by the stage 210 such that the light-emitting devices 1000 are adhered by suction to the stage 210. The various processes which are to be performed on each of the light-emitting devices 1000 can be efficiently carried out.

The surface 30s of the plastic film 30 delaminated from the glass base 10 is active. Therefore, the surface 30s may be covered with a protection film or subjected to a surface treatment for conversion to a hydrophobic surface before various parts are mounted to the surface 30s.

Figure 21:
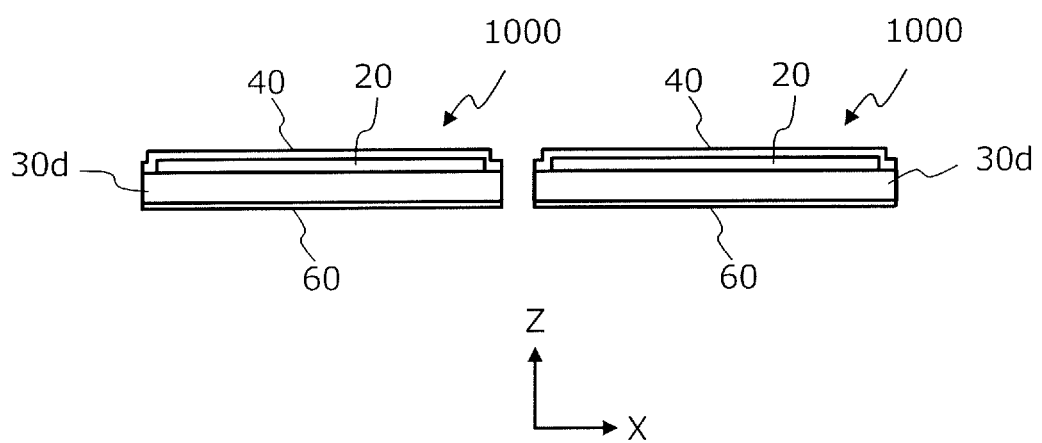
FIG. 21 is a cross-sectional view showing flexible light-emitting devices detached from the stage.

FIG. 21 is a cross-sectional view schematically showing the light-emitting devices 1000 detached from the stage 210 after the sheet-like part (functional film) 60 is mounted to the light-emitting devices 1000.

According to the prior art, the plastic film is delaminated from the glass base before the light-emitting devices 1000 are divided from one another. Therefore, when a subsequent process is carried out, a large number of light-emitting devices 1000 are bound to a single plastic film. Thus, it is difficult to carry out an efficient process on each of the light-emitting devices 1000. When the light-emitting devices 1000 are divided from one another after the sheet-like part is attached, a portion of the sheet-like part which is present in an intermediate region between adjoining two of the light-emitting devices 1000 is useless.

On the other hand, according to the embodiment of the present disclosure, a large number of light-emitting devices 1000 are still orderly arrayed on the stage 210 after being delaminated from the glass base 10. Therefore, various processes can be efficiently performed on the light-emitting devices 1000 sequentially or concurrently.

Figure 22:
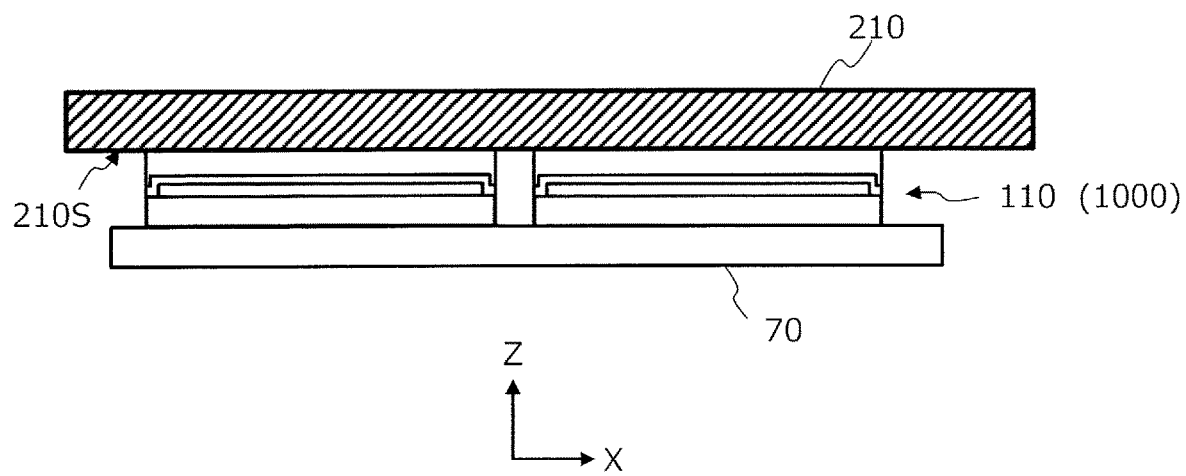
FIG. 22 is a cross-sectional view showing another protection sheet bound to a plurality of light-emitting devices which are in contact with the stage.

After the step of separating the multilayer stack 100 into the first portion 110 and the second portion 120, the step of adhering another protection sheet (second protection sheet) 70 to the plurality of light-emitting devices 1000 which are in contact with the stage 210 may be further performed as shown in FIG. 22. The second protection sheet 70 can perform the function of temporarily protecting the surface of the flexible substrate regions 30d of the plastic film 30 delaminated from the glass base 10. The second protection sheet 70 can have the same laminate structure as that of the previously-described protection sheet 50. The protection sheet 50 can be referred to as "first protection sheet 50".

The second protection sheet 70 may be adhered to the plurality of light-emitting devices 1000 after various processes which have previously been described are performed on the plurality of light-emitting devices 1000 which are in contact with the stage 210.

When suction of the light-emitting devices 1000 by the stage 210 is stopped after the second protection sheet 70 is adhered, the plurality of light-emitting devices 1000 which are bound to the second protection sheet 70 can be detached from the stage 210. Thereafter, the second protection sheet 70 can function as a carrier for the plurality of light-emitting devices 1000. This is transfer of the light-emitting devices 1000 from the stage 210 to the second protection sheet 70. Various processes may be sequentially or concurrently performed on the plurality of light-emitting devices 1000 which are bound to the second protection sheet 70.

Figure 23:
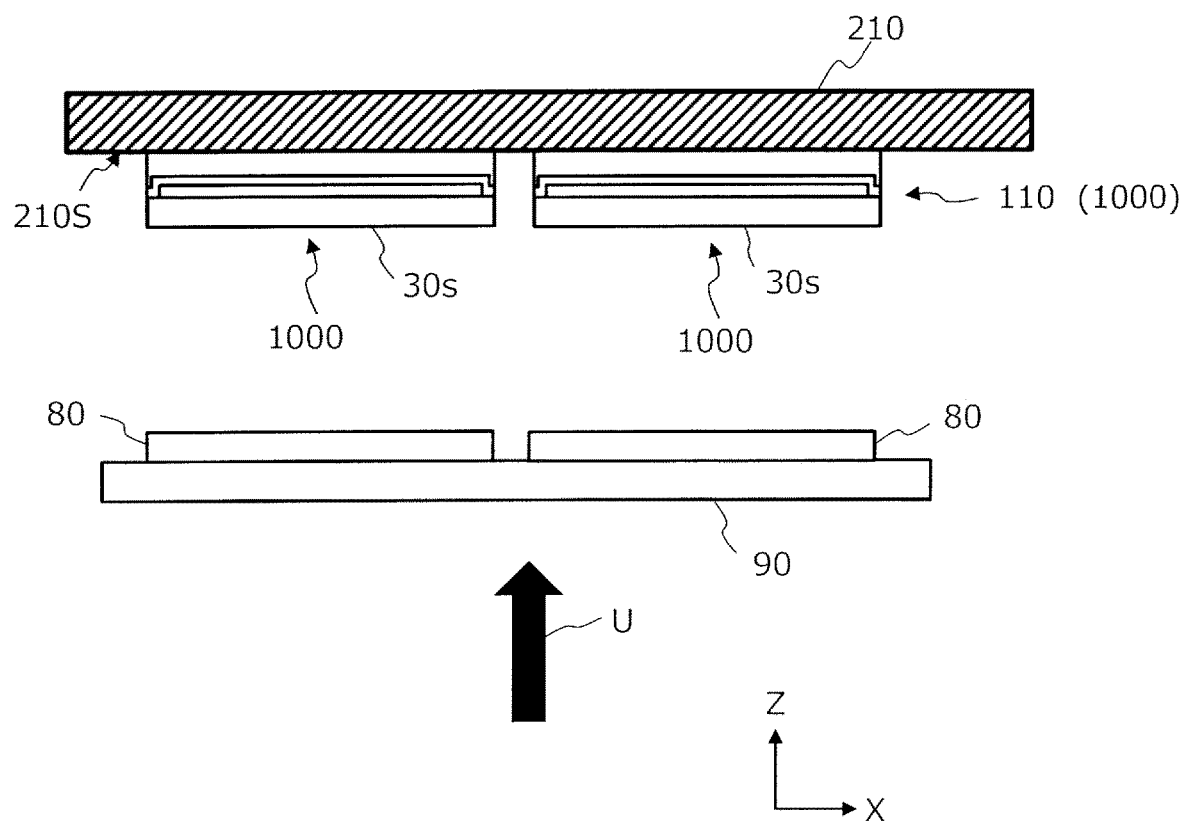
FIG. 23 is a cross-sectional view showing a carrier sheet carrying a plurality of parts which are to be mounted to the plurality of light-emitting devices.

FIG. 23 is a cross-sectional view showing a carrier sheet 90 carrying a plurality of parts (functional films) 80 which are to be mounted to the plurality of light-emitting devices 1000. By moving this carrier sheet 90 in the direction of arrow U, the respective parts 80 can be attached to the light-emitting devices 1000. The upper surface of the parts 80 has an adhesive layer which is capable of strongly adhering to the light-emitting devices 1000. Meanwhile, the adhesion between the carrier sheet 90 and the parts 80 is relatively weak. Using such a carrier sheet 90 enables a simultaneous "transfer" of the parts 80. Such a transfer is readily realized because the plurality of light-emitting devices 1000 are regularly arrayed on the stage 210 while the light-emitting devices 1000 are supported by the stage 210.

Hereinafter, the configuration of the multilayer stack 100 before the dividing of FIG. 2 is described in more detail.

Figure 24A:
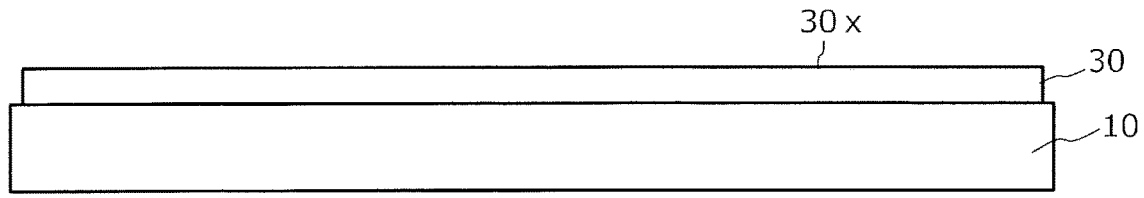
FIG. 24A is a cross-sectional view illustrating a step of the flexible light-emitting device production method in an embodiment of the present disclosure.

First, see FIG. 24A. FIG. 24A is a cross-sectional view showing the glass base 10 with the plastic film 30 provided on the surface of the glass base 10. The glass base 10 is a supporting substrate for processes. The thickness of the glass base 10 can be, for example, about 0.3-0.7 mm.

In the present embodiment, the plastic film 30 is a polyimide film having a thickness of, for example, not less than 5 μm and not more than 100 μm. The polyimide film can be formed from a polyamide acid, which is a precursor of polyimide, or a polyimide solution. The polyimide film may be formed by forming a polyamide acid film on the surface of the glass base 10 and then thermally imidizing the polyamide acid film. Alternatively, the polyimide film may be formed by forming, on the surface of the glass base 10, a film from a polyimide solution which is prepared by melting a polyimide or dissolving a polyimide in an organic solvent. The polyimide solution can be obtained by dissolving a known polyimide in an arbitrary organic solvent. The polyimide solution is applied to the surface 10s of the glass base 10 and then dried, whereby a polyimide film can be formed.

In the case of a bottom emission type flexible display, it is preferred that the polyimide film realizes high transmittance over the entire range of visible light. The transparency of the polyimide film can be represented by, for example, the total light transmittance in accordance with JIS K7105-1981. The total light transmittance can be set to not less than 80% or not less than 85%. On the other hand, in the case of a top emission type flexible display, it is not affected by the transmittance.

The plastic film 30 may be a film which is made of a synthetic resin other than polyimide. Note that, however, in the embodiment of the present disclosure, the process of forming a thin film transistor includes a heat treatment at, for example, not less than 350° C., and therefore, the plastic film 30 is made of a material which will not be deteriorated by this heat treatment.

The plastic film 30 may be a multilayer structure including a plurality of synthetic resin layers. In one form of the present embodiment, in delaminating a flexible display structure from the glass base 10, laser lift-off is carried out such that the plastic film 30 is irradiated with ultraviolet laser light transmitted through the glass base 10. A part of the plastic film 30 at the interface with the glass base 10 needs to absorb the ultraviolet laser light and decompose (disappear). Alternatively, for example, a sacrificial layer which is to absorb laser light of a certain wavelength band and produce a gas may be provided between the glass base 10 and the plastic film 30. In this case, the plastic film 30 can be easily delaminated from the glass base 10 by irradiating the sacrificial layer with the laser light. Providing the sacrificial layer also achieves the effect of suppressing generation of ashes.

<Polishing>

When there is an object (target) which is to be polished away, such as particles or protuberances, on the surface 30x of the plastic film 30, the target may be polished away using a polisher such that the surface becomes flat. Detection of a foreign object, such as particles, can be realized by, for example, processing of an image obtained by an image sensor. After the polishing process, a planarization process may be performed on the surface 30x of the plastic film 30. The planarization process includes the step of forming a film which improves the flatness (planarization film) on the surface 30x of the plastic film 30. The planarization film does not need to be made of a resin.

<Lower Gas Barrier Film>

Then, a gas barrier film may be formed on the plastic film 30. The gas barrier film can have various structures. Examples of the gas barrier film include a silicon oxide film and a silicon nitride film. Other examples of the gas barrier film can include a multilayer film including an organic material layer and an inorganic material layer. This gas barrier film may be referred to as "lower gas barrier film" so as to be distinguishable from a gas barrier film covering the functional layer regions 20, which will be described later. The gas barrier film covering the functional layer regions 20 can be referred to as "upper gas barrier film".

<Functional Layer Region>

Hereinafter, the process of forming the functional layer regions 20, including the TFT layer 20A and the light-emitting device layer 20B, and the upper gas barrier film 40 is described.

Figure 24B:
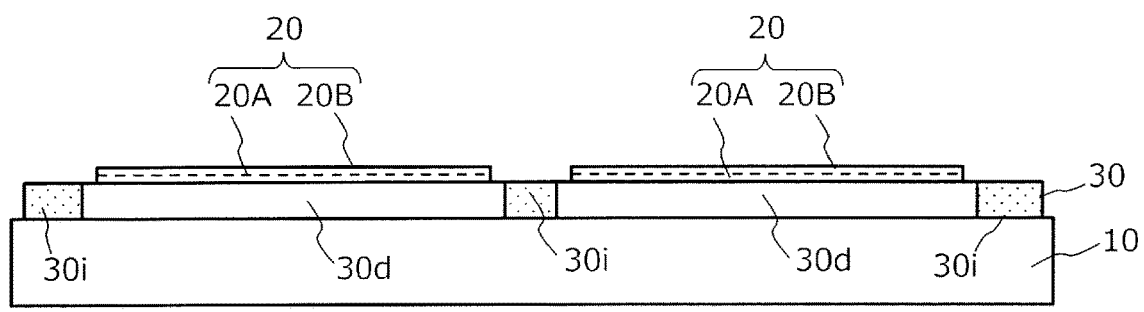
FIG. 24B is a cross-sectional view illustrating a step of the flexible light-emitting device production method in an embodiment of the present disclosure.

First, as shown in FIG. 24B, a plurality of functional layer regions 20 are formed on a glass base 10. There is a plastic film 30 between the glass base 10 and the functional layer regions 20. The plastic film 30 is bound to the glass base 10.

More specifically, the functional layer regions 20 include a TFT layer 20A (lower layer) and a light-emitting device layer 20B (upper layer). The TFT layer 20A and the light-emitting device layer 20B are sequentially formed by a known method. When the light-emitting device is a display, the TFT layer 20A includes a circuit of a TFT array which realizes an active matrix. The light-emitting device layer 20B includes an array of light-emitting devices (OLED devices and/or micro LED devices), each of which can be driven independently.

The chip size of the micro LED devices is, for example, smaller than 100 μm×100 μm. The micro LED devices can be made of different inorganic semiconductor materials according to the color or wavelength of light to be radiated. Identical semiconductor chips may include a plurality of semiconductor multilayer stacks of different compositions such that light of different colors, R (red), G (green) and B (blue), are radiated from the respective semiconductor multilayer stacks. As well known in the art, a semiconductor chip which radiates ultraviolet light or a semiconductor chip which radiates blue light may be combined with various phosphor materials such that light of R, G and B are radiated.

The thickness of the TFT layer 20A is, for example, about 4 μm. The thickness of the light-emitting device layer 20B including the OLED devices is, for example, 1 μm. The thickness of the light-emitting device layer 20B including the micro LED devices can be, for example, not less than 10 μm.

Figure 25:
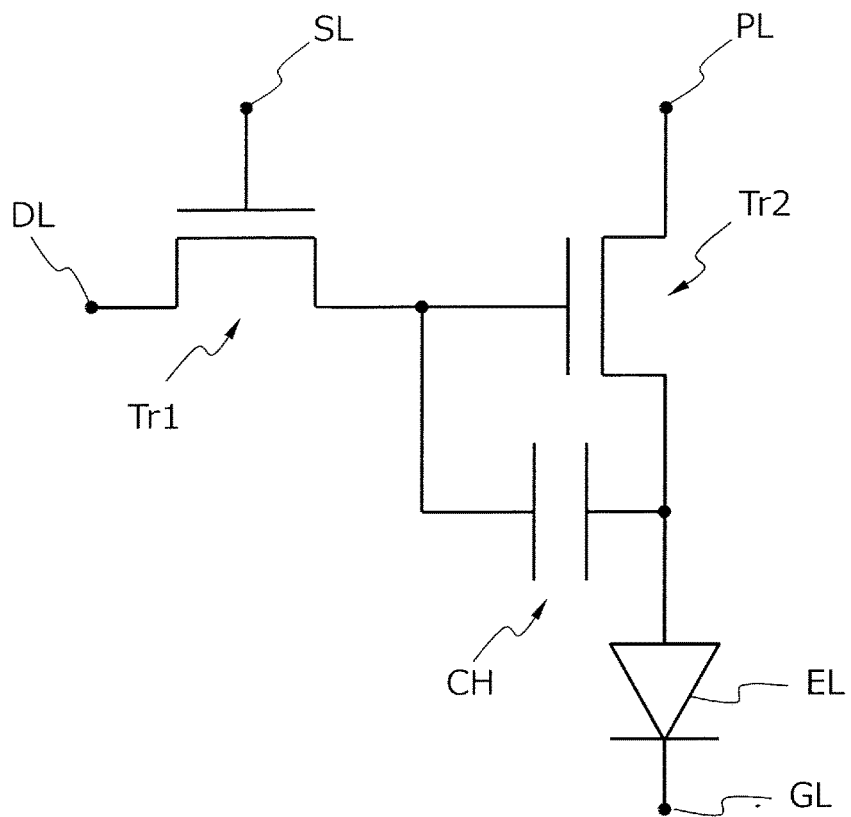
FIG. 25 is an equivalent circuit diagram of a single sub-pixel in a flexible light-emitting device.

FIG. 25 is a basic equivalent circuit diagram of a sub-pixel in a display which is an example of the light-emitting device. A single pixel of the display can consist of sub-pixels of different colors such as, for example, R, G, and B. The example illustrated in FIG. 25 includes a selection TFT element Tr1, a driving TFT element Tr2, a storage capacitor CH, and a light-emitting device EL. The selection TFT element Tr1 is connected with a data line DL and a selection line SL. The data line DL is a line for transmitting data signals which define an image to be displayed. The data line DL is electrically coupled with the gate of the driving TFT element Tr2 via the selection TFT element Tr1. The selection line SL is a line for transmitting signals for controlling the ON/OFF state of the selection TFT element Tr1. The driving TFT element Tr2 controls the state of the electrical connection between a power line PL and the light-emitting device EL. When the driving TFT element Tr2 is ON, an electric current flows from the power line PL to a ground line GL via the light-emitting device EL. This electric current allows the light-emitting device EL to emit light. Even when the selection TFT element Tr1 is OFF, the storage capacitor CH maintains the ON state of the driving TFT element Tr2.

The TFT layer 20A includes a selection TFT element Tr1, a driving TFT element Tr2, a data line DL, and a selection line SL. The light-emitting device layer 20B includes a light-emitting device EL. Before formation of the light-emitting device layer 20B, the upper surface of the TFT layer 20A is planarized by an interlayer insulating film that covers the TFT array and various wires. A structure which supports the light-emitting device layer 20B and which realizes active matrix driving of the light-emitting device layer 20B is referred to as "backplane".

The circuit elements and part of the lines shown in FIG. 25 can be included in any of the TFT layer 20A and the light-emitting device layer 20B. The lines shown in FIG. 25 are connected with an unshown driver circuit.

In the embodiment of the present disclosure, the TFT layer 20A and the light-emitting device layer 20B can have various specific configurations. These configurations do not limit the present disclosure. The TFT element included in the TFT layer 20A may have a bottom gate type configuration or may have a top gate type configuration. Emission by the light-emitting device included in the light-emitting device layer 20B may be of a bottom emission type or may be of a top emission type. The specific configuration of the light-emitting device is also arbitrary.

The material of a semiconductor layer which is a constituent of the TFT element includes, for example, crystalline silicon, amorphous silicon, and oxide semiconductor. In the embodiment of the present disclosure, part of the process of forming the TFT layer 20A includes a heat treatment step at 350° C. or higher for the purpose of improving the performance of the TFT element.

<Upper Gas Barrier Film>

Figure 24C:
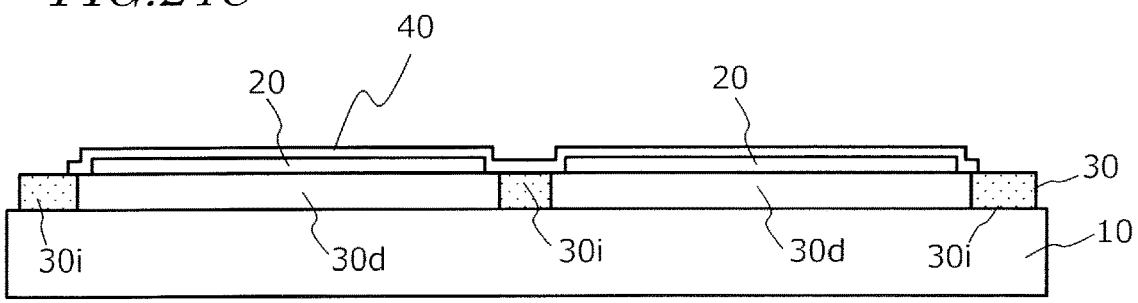
FIG. 24C is a cross-sectional view illustrating a step of the flexible light-emitting device production method in an embodiment of the present disclosure.

After formation of the above-described functional layer, the entirety of the functional layer regions 20 is covered with a gas barrier film (upper gas barrier film) 40 as shown in FIG. 24C. A typical example of the upper gas barrier film 40 is a multilayer film including an inorganic material layer and an organic material layer. Elements such as an adhesive film, another functional layer which is a constituent of a touchscreen, polarizers, etc., may be provided between the upper gas barrier film 40 and the functional layer regions 20 or in a layer overlying the upper gas barrier film 40. Formation of the upper gas barrier film 40 can be realized by a Thin Film Encapsulation (TFE) technique. From the viewpoint of encapsulation reliability, the WVTR (Water Vapor Transmission Rate) of a thin film encapsulation structure is typically required to be not more than $1 \times 10^{-4}$ g/m²/day. According to the embodiment of the present disclosure, this criterion is met. The thickness of the upper gas barrier film 40 is, for example, not more than 1.5 µm.

Figure 26:
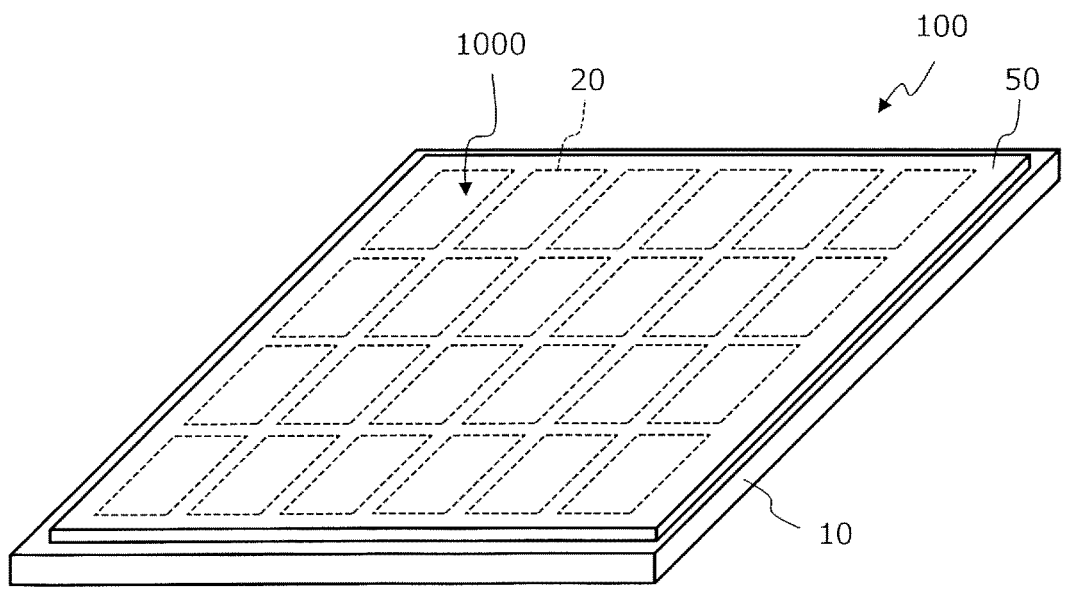
FIG. 26 is a perspective view of the multilayer stack in the middle of the production process.

FIG. 26 is a perspective view schematically showing the upper surface side of the multilayer stack 100 at a point in time when the upper gas barrier film 40 is formed. A single multilayer stack 100 includes a plurality of light-emitting devices 1000 supported by the glass base 10. In the example illustrated in FIG. 26, a single multilayer stack 100 includes a larger number of functional layer regions 20 than in the example illustrated in FIG. 1A. As previously described, the number of functional layer regions 20 supported by a single glass base 10 is arbitrary.

<Protection Sheet>

Figure 24D:
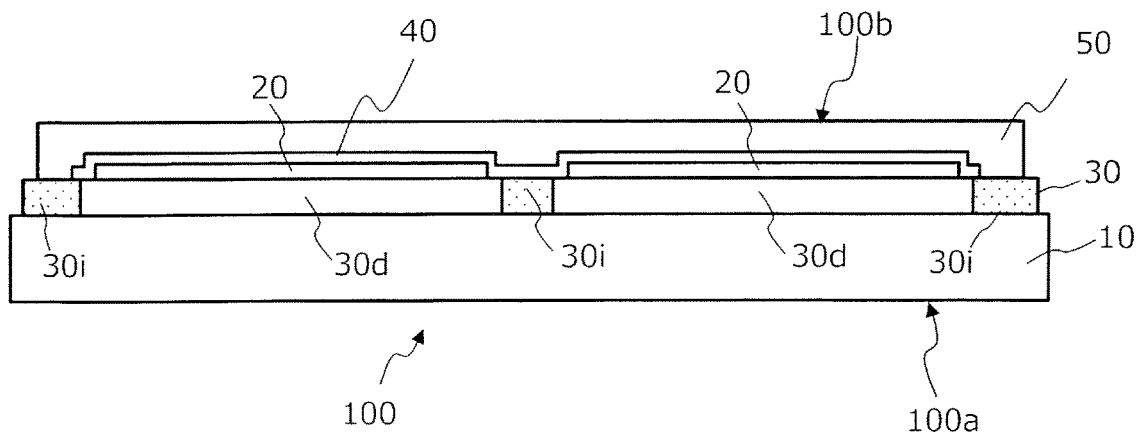
FIG. 24D is a cross-sectional view illustrating a step of the flexible light-emitting device production method in an embodiment of the present disclosure.

Next, refer to FIG. 24D. As shown in FIG. 24D, a protection sheet 50 is adhered to the upper surface of the multilayer stack 100. The protection sheet 50 can be made of a material such as, for example, polyethylene terephthalate (PET), polyvinyl chloride (PVC), or the like. As previously described, a typical example of the protection sheet 50 has a laminate structure which includes a layer of an applied mold-releasing agent at the surface. The thickness of the protection sheet 50 can be, for example, not less than 50 µm and not more than 200 µm.

After the thus-formed multilayer stack 100 is provided, the production method of the present disclosure can be carried out using the above-described production apparatus (delaminating apparatus 220).

INDUSTRIAL APPLICABILITY

An embodiment of the present invention provides a novel flexible light-emitting device production method. A flexible light-emitting device is broadly applicable to smartphones, tablet computers, on-board displays, and small-, medium- and large-sized television sets. The flexible light-emitting device can also be used as an illumination device.

REFERENCE SIGNS LIST

10 . . . glass base, 20 . . . functional layer region, 20A . . . TFT layer, 20B . . . light-emitting device layer, 30 . . . plastic film, 30d . . . flexible substrate region of plastic film, 30i . . . intermediate region of plastic film, 40 . . . gas barrier film, 50 . . . protection sheet, 100 . . . multilayer stack, 210 . . . stage, 220 . . . lift-off light irradiation unit (delaminating apparatus), 1000 . . . light-emitting device

The invention claimed is:

1. A method for producing a flexible light-emitting device, comprising:
   providing a multilayer stack which has a first surface and a second surface, the multilayer stack including
      a glass base which defines the first surface,
      a plurality of functional layer regions each including a TFT layer and a light-emitting device layer,
      a synthetic resin film provided between the glass base and the plurality of functional layer regions and bound to the glass base, the synthetic resin film including a plurality of flexible substrate regions respectively supporting the plurality of functional layer regions and an intermediate region surrounding the plurality of flexible substrate regions, and
      a protection sheet which covers the plurality of functional layer regions and which defines the second surface;
   dividing the intermediate region and respective ones of the plurality of flexible substrate regions of the synthetic resin film from one another;
   irradiating an interface between the synthetic resin film and the glass base with lift-off light; and
   separating the multilayer stack into a first portion and a second portion by increasing a distance from a stage to the glass base while the second surface of the multilayer stack is kept in contact with the stage,
   wherein the first portion of the multilayer stack includes a plurality of light-emitting devices which are, in contact with the stage, and the plurality of light-emitting devices respectively include the plurality of functional layer regions and include the plurality of flexible substrate regions of the synthetic resin film,
   the second portion of the multilayer stack includes the glass base and the intermediate region of the synthetic resin film,
   irradiating the interface between the plurality of flexible substrate regions of the synthetic resin film and the glass base with the lift-off light includes
      first light scanning for scanning the interface in a first direction parallel to the interface with the lift-off light in the form of a line beam which is transverse to the first direction, and
      second light scanning for scanning the interface in a second direction which is parallel to the interface and different from the first direction with the lift-off light in the form of a line beam which is transverse to the second direction, and
   in each of the first and second light scanning, an irradiation intensity of the lift-off light is modulated such that an irradiation intensity of the lift-off light for at least part of an interface between the intermediate region of the synthetic resin film and the glass base is lower than an irradiation intensity of the lift-off light for the interface between the plurality of flexible substrate regions of the synthetic resin film and the glass base,
   wherein the lift-off light is incoherent light.

2. The method of claim 1, wherein
   in each of the first and second light scanning, an irradiation intensity of the lift-off light is lower than a threshold level which is necessary for delaminating the plurality of flexible substrate regions of the synthetic resin film from the glass base through a single scanning cycle, and
   a sum of irradiation intensities of the lift-off light in the first and second light scanning is higher than the threshold level.

3. The method of claim 1, wherein providing the multilayer stack includes providing a delamination layer between the glass base and the synthetic resin film.

4. The method of claim 3, wherein the delamination layer is made of a metal or a semiconductor.

5. The method of claim 1, wherein
the lift-off light is a line beam extending in a direction parallel to a peripheral edge of the glass base, and
irradiating the interface between the synthetic resin film and the glass base with the lift-off light includes moving, an irradiation region on the interface which is to be irradiated with the lift-off light in another direction which is transverse to an extending direction of the line beam.

6. The method of claim 5, wherein the at least part of the interface between the intermediate region of the synthetic resin film and the glass base includes two parallel stripe regions extending along the peripheral edge of the glass base.

7. The method of claim 6, wherein the at least part of the interface between the intermediate region of the synthetic resin film and the glass base includes at least one middle stripe region which is parallel to the stripe regions.

8. The method of claim 1, wherein the at least part of the interface between the intermediate region of the synthetic resin film and the glass base has a width which is not less than 50% of a width of the intermediate region.

9. The method of claim 1, wherein the at least part of the interface between the intermediate region of the synthetic resin film and the glass base has a width which is not less than 1 mm.

10. The method of claim 1 further comprising, after separating the multilayer stack into the first portion and the second portion, sequentially or concurrently performing a process on the plurality of light-emitting devices which are in contact with the stage.

11. The method of claim 10, wherein the process includes any of attaching, a dielectric and/or electrically-conductive film to each of the plurality of light-emitting devices, cleaning or etching each of the plurality of light-emitting devices, and mounting an optical part and/or an electronic part to each of the plurality of light-emitting devices.

* * * * *